United States Patent [19]
Horihata et al.

[11] Patent Number: 5,777,933
[45] Date of Patent: Jul. 7, 1998

[54] SEMICONDUCTOR MEMORY DEVICE CAPABLE OF READING/WRITING DATA FROM/INTO ARBITRARY MEMORY CELL IN AN INPUT/OUTPUT COMPRESSION TEST MODE

[75] Inventors: Shuichi Horihata; Hiroshi Akamatsu, both of Hyogo, Japan

[73] Assignee: Mitsubishi Denki Kabushiki Kaisha, Tokyo, Japan

[21] Appl. No.: 878,178

[22] Filed: Jun. 18, 1997

[30] Foreign Application Priority Data

Feb. 14, 1997 [JP] Japan .................. 9-030639

[51] Int. Cl.$^6$ .................................. G11C 29/00
[52] U.S. Cl. ............... 365/201; 365/189.07; 365/240; 365/230.03; 365/189.03; 371/21.2
[58] Field of Search ............... 365/201, 189.07, 365/240, 230.03, 189.03; 371/21.2

[56] References Cited

U.S. PATENT DOCUMENTS 5,579,272  11/1996  Uchida .................. 365/201

FOREIGN PATENT DOCUMENTS 5-211000  8/1993  Japan .................. G11C 29/00

*Primary Examiner*—David C. Nelms
*Assistant Examiner*—Andrew Q. Tran
*Attorney, Agent, or Firm*—McDermott, Will & Emery

[57] ABSTRACT

A compression reading switch circuit is provided between a data equality/inequality determination circuit and compressed one data input/output terminal in a DRAM. In the I/O compression mode, desired data can be read out among output data DOT from the determination circuit and read data D01–D04 thereby specifying a defective memory cell among four memory cells.

10 Claims, 27 Drawing Sheets

FIG. 15A /RAS

FIG. 15B /CAS

SEMICONDUCTOR MEMORY DEVICE CAPABLE OF READING/WRITING DATA FROM/INTO ARBITRARY MEMORY CELL IN AN INPUT/OUTPUT COMPRESSION TEST MODE

BACKGROUND OF THE INVENTION

1. Field of the Invention

The present invention relates to a semiconductor memory device, and more particularly relates to a semiconductor memory device having a test mode in which a plurality of data input/output terminals are compressed into one predetermined data input/output terminal.

2. Description of the Background Art

As the storage capacity of semiconductor memory devices (DRAM, SRAM and the like) has been increased, the data input/output terminals of the semiconductor memory device have a tendency to increase in number. A semiconductor memory device having a plurality of data input/output terminals can input and output multibit data in parallel and thus can be used for a system employing wide data buses.

FIG. 23 is a block diagram showing a configuration of a DRAM provided with such plurality of data input/output terminals.

With reference to FIG. 23, the DRAM includes: control signal input terminals 101–103, 105; a group of address signal input terminals 104; n data input/output terminals 106.1–106.n (n is a natural number having a value of at least 2); a ground terminal 107; and a power supply terminal 108. The DRAM further includes: a clock generating circuit 109; a row and column address buffer 110; a row decoder 111; a column decoder 112; a memory mat 113; a write circuit 116; and a read circuit 117. Memory mat 113 has a memory array 114 and a sense refresh amplifier plus an input/output control circuit 115.

Clock generating circuit 109 selects a prescribed operation mode according to signals /RAS, /CAS, and /W externally supplied via control signal input terminals 101, 102 and 103, and controls the entire DRAM.

Row and column address buffer 110 produces row address signals RA0–RAi and column address signals CA0–CAi based on address signals A0–Ai (i is a natural number) externally supplied via group of address signal input terminals 104, and supplies the produced signals RA0–RAi and CA0–CAi respectively to row decoder 111 and column decoder 112.

Memory array 114 includes a plurality of memory cells each storing data of 1 bit. The plurality of memory cells are divided into groups each having n cells, and each group is arranged at a prescribed address determined according to the row address and the column address.

Responsive to row address signals RA0–RAi provided from row and column address buffer 110, row decoder 111 designates a row address in memory array 114. Responsive to column address signals CA0–CAi provided from row and column address buffer 110, column decoder 112 designates a column address in memory array 114.

Sense refresh amplifier plus input/output control circuit 115 connects respective n memory cells at the address designated by row decoder 111 and column decoder 112 to one ends of data input/output line pairs I/O1-I/On. The other ends of data input/output line pairs I/O1-I/On are connected to write circuit 116 and read circuit 117. Responsive to signal /W externally supplied via control signal input terminal 103 in a write mode, write circuit 116 provides data input from data input/output terminals 106.1–106.n to the selected n memory cells via data input/output line pairs I/O1-I/On. Read circuit 117, responsive to signal /OE input from control signal input terminal 105 in a read mode, outputs data read from the selected n memory cells to data input/output terminals 106.1–106.n.

FIG. 24 is a block diagram of a partially omitted circuit illustrating a configuration of memory mat 113 of the DRAM in FIG. 23.

Referring to FIG. 24, memory array 114 includes a plurality of memory cells MC arranged in rows and columns, a word line WL provided corresponding to each row, and a bit line pair BL, /BL provided corresponding to each column.

Sense refresh amplifier plus input/output control circuit 115 includes a sense refresh amplifier SA and column selection gate CSG provided corresponding to each column, and n sets of data input/output line pairs I/O1-I/On. Column selection gate CSG includes two N channel MOS transistors.

Bit line pairs BL, /BL, sense refresh amplifiers SA and column selection gates CSG are divided into groups each having n of them respectively in advance. Bit line pairs BL1, /BL1; ... ; BLn, /BLn in each group are connected to data input/output line pairs I/O1-I/On via corresponding sense refresh amplifiers SA1–SAn and column selection gates CSG1–CSGn.

Each of the groups is provided with one column selection line CSL. When column selection line CSL in the group is selected by column decoder 112, column selection gates CSG1–CSGn connected to the column selection line CSL become conductive, and bit line pairs BL1, /BL1; ... ; BLn, /BLn in the group are connected to data input/output line pairs I/O1-I/On.

An operation of the DRAM shown in FIGS. 23 and 24 will be briefly described. In the write mode, column decoder 112 raises column selection line CSL in a group according to column address signals CA0–CAi to "H" level (selection level) and turns on column selection gates CSG1–CSGn.

Responsive to signal /W, write circuit 116 supplies write data from data input/output terminals 106.1–106.n to bit line pairs BL1, /BL1–BLn, /BLn in the selected group via data input/output line pairs I/O1-I/On. Next row decoder 111 raises word line WL in a row according to row address signals RA0–RAi to "H" level (selection level), and activates memory cell MC in the row. The data in the corresponding bit line pair BL, /BL is written in a form of charge amount into the activated memory cell MC.

In the reading mode, after the potential between bit lines BL and /BL of each pair is equalized, row decoder 111 raises word line WL in a row according to row address signals RA0–RAi to "H" level of the selection level. The potential on bit lines BL and /BL slightly changes according to the data in the activated memory cell MC. Sense refresh amplifier SA is next activated, one of the bit lines BL and /BL having higher potential is pulled up to the supply potential Vcc, and the other bit line is pulled down to the ground potential GND.

Column decoder 112 raises column selection line CSL in a group according to column address signals CA0–CAi to "H" level of the selection level, and turns on column selection gates CSG1–CSGn in the group. The data in bit line pairs BL1, /BL1; ... ; BLn, /BLn in the selected group is supplied to read circuit 117 via column selection gates CSG1–CSGn and data input/output line pairs I/O1-I/On. Read circuit 117, responsive to signal /OE, outputs the read data of n bits to data input/output terminals 106.1–106.n.

In such a DRAM, a test is necessary for checking if each memory cell MC is normal or not by writing/reading data into/out of each memory cell MC before shipping. However, since the number of data input/output terminals in the test device is limited, the number of DRAM which can be tested simultaneously by a single test device decreases proportionally to the increase in the number of data input/output terminals 106.1–106.n, resulting in increase in the cost of testing. Accordingly, a test mode is provided for such a DRAM in which n memory cells MC can be tested simultaneously using one data input/output terminal such that a number of DRAM can be tested by one test device (the test mode is hereinafter referred to as I/O compression mode).

FIG. 25 is a block diagram of a partially omitted circuit showing a configuration of a data equality/inequality determination circuit 120 utilized in the I/O compression mode.

Referring to FIG. 25, data equality/inequality determination circuit 120 includes NOR gates 121 and 124, an NAND gate 122, and an inverter 123, and is provided in, for example, read circuit 117 in FIG. 23.

Each of NOR gate 121 and NAND gate 122 receives data DO1–DOn read from the selected n memory cells MC. An output of NOR gate 121 is supplied to one input node of NOR gate 124. An output of NAND gate 122 is supplied to the other input node of NOR gate 124 via inverter 123. An output DOT of NOR gate 124 is input to a test device via predetermined terminal (e.g. 106.1) among data input/output terminals 106.1–106.n in FIG. 23.

The selected n memory cells MC have identical data written thereto in advance. If all the read data DO1–DOn are equal, the output from NOR gate 121 or the output from inverter 123 becomes "H" level, and the output from NOR gate 124 becomes "L" level. If the read data DO1–DOn are not equal, outputs from both of NOR gate 121 and inverter 123 attain "L" level, and the output from NOR gate 124 attains "H" level.

The test device determines that n memory cells MC are normal when output DOT from NOR gate 124 is "L" level, and determines that at least one of n memory cells MC is defective when output DOT from NOR gate 124 is "H" level.

In the I/O compression mode, outputting of read data DO1–DOn to data input/output terminals 106.1–106.n is inhibited in order to avoid the confliction among data at data input/output terminals 106.1–106.n.

FIG. 26 is a block diagram of a partially omitted circuit illustrating compression writing switch circuits 131.1–131.n employed in the I/O compression mode.

Referring to FIG. 26, input buffers 130.1–130.n and compression writing switch circuits 131.1–131.n are provided in write circuit 116 in FIG. 23 corresponding to data input/output terminals 106.1–106.n. Input buffer 130.1 transmits a write data DI1 and a write data DIT for testing supplied externally via data input/output terminal 106.1 to each of compression writing switch circuits 131.1–131.n. Input buffers 130.2–130.n transmit write data DI2–DIn externally supplied via data input/output terminals 106.2–106.n respectively to compression writing switch circuits 131.2–131.n.

As shown in FIG. 27, compression writing switch circuit 131.n includes one input node N132 receiving data DIn, the other input node N134 receiving data DIT, an output node N136 which outputs data DIn or DIT, switching inverters 132 and 133, and inverters 134–136. Switching inverter 132 and inverter 136 are connected in series between one input node N132 and output node N136. Inverters 134 and 135 and switching inverter 133 are connected in series between the other input node N134 and an input node of inverter 136. Signals /TE and TE are respectively supplied to supply nodes 132a and 133a of switching inverters 132 and 133. To ground nodes 132b and 133b of switching inverters 132 and 133, signals TE and /TE are respectively input. The configurations of other compression writing switch circuits 131.1–131.n-1 are similar to that of compression writing switch circuit 131.n.

In the normal write operation, write data DI1–DIn are provided to data input/output terminals 106.1–106.n, and signal TE becomes "L" level. Write data DI-DIn are supplied to the one input nodes N132 of compression writing switch circuits 131.1–131.n via input buffers 130.1–130.n, and output to output nodes N136 via switching inverters 132 and inverters 136. Write data DI1–DIn output from compression writing switch circuits 131.1–131.n are respectively written into the selected n memory cells MC.

In the I/O compression mode, write data for testing DIT is supplied to data input/output terminal 106.1 by the test device, and signal TE attains "H" level. Data DIT is supplied to the other input nodes N134 in compression writing switch circuits 131.1–131.n via input buffer 130.1, and output from output nodes N136 via inverters 134 and 135, switching inverters 133, and inverters 136. Data DIT respectively output from compression writing switch circuits 131.1–131.n are written into the selected n memory cells MC respectively.

In the conventional I/O compression mode, even if at least one of n memory cells MC can be determined to be defective by data equality/inequality determination circuit in FIG. 25, to specify which memory cell MC is defective is impossible.

Further, in the conventional I/O compression mode, even if identical data DIT can be written from one data input/output terminal 106.1 to n memory cells MC by compression writing switch circuits 131.1–131.n in FIGS. 26 and 27, to write arbitrary data into each of n memory cells MC is impossible. Therefore, the degree of interference cannot be tested when different data are written into two memory cells MC adjacent to each other.

SUMMARY OF THE INVENTION

One object of the present invention is to provide a semiconductor memory device capable of reading data in an arbitrary memory cell from one data input/output terminal in the I/O compression mode.

Another object of the present invention is to provide a semiconductor memory device capable of writing data into an arbitrary memory cell from one data input/output terminal in the I/O compression mode.

A semiconductor memory device according to one aspect of the invention includes a determination circuit for determining equality/inequality of a plurality of read data, as well as a gate circuit for providing data selected from the plurality of read data to a predetermined data input/output terminal. Accordingly, a defective memory cell, among a plurality of memory cells from which the plurality of data are read, can be specified by determining the data output to the predetermined data input/output terminal.

Preferably, a first test signal for activating the determination circuit and a second test signal for activating the gate circuit are supplied from a predetermined data input/output terminal. In this case, the first and second test signals can be input easily.

Preferably, a plurality of memory cells are sequentially selected and reading/writing of data from/into each memory cell are carried out. Accordingly, simplification of the test operation can be achieved.

Preferably, a memory cell selection signal is supplied from an address signal input terminal. Accordingly, input of the memory cell selection signal is facilitated.

A semiconductor memory device according to another aspect of the invention includes a first write circuit for writing data supplied to a predetermined data input/output terminal into a plurality of memory cells in parallel, and a second write circuit for writing data supplied to a predetermined data input/output terminal into a memory cell selected from the plurality of memory cells. Accordingly, different data can be written into each of two memory cells adjacent to each other, and the degree of interference between the two adjacent memory cells can be tested.

Preferably, a plurality of memory cells are sequentially selected, and reading/writing of data from/ into each memory cell are carried out. In this case, the test operation is simplified.

Preferably, a memory cell selection signal is supplied from an address signal input terminal. Accordingly, the memory cell selection signal can be input easily.

Preferably, a determination circuit for determining equality/inequality of a plurality of read data and a gate circuit for supplying data selected from the plurality of read data to a predetermined data input/output terminal are provided. Accordingly, a defective memory cell among a plurality of memory cells from which the plurality of data are read can be specified by determining the data output to the predetermined data input/output terminal.

Preferably, a third test signal for activating the determination circuit as well as a fourth test signal for activating the gate circuit are supplied from a predetermined data input/output terminal. Therefore, input of the third and fourth test signals is facilitated.

A semiconductor memory device according to further aspect of the invention includes a plurality of groups of data input/output terminals corresponding to a plurality of memory arrays. A plurality of data input/output terminals in each group are compressed into a predetermined data input/output terminal in each group. A determination circuit is provided corresponding to each memory array for determining equality/inequality of a plurality of data read from corresponding memory array and outputting the result of the determination to a corresponding predetermined data input/output terminal. Further, a gate circuit is provided for passing the plurality of data read from a selected memory array respectively through a plurality of predetermined data input/output terminals. Accordingly, a defective memory cell can be specified and the semiconductor memory device can be easily adjusted to the increase in the number of data input/output terminals.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS (First Embodiment)

Figure 1:
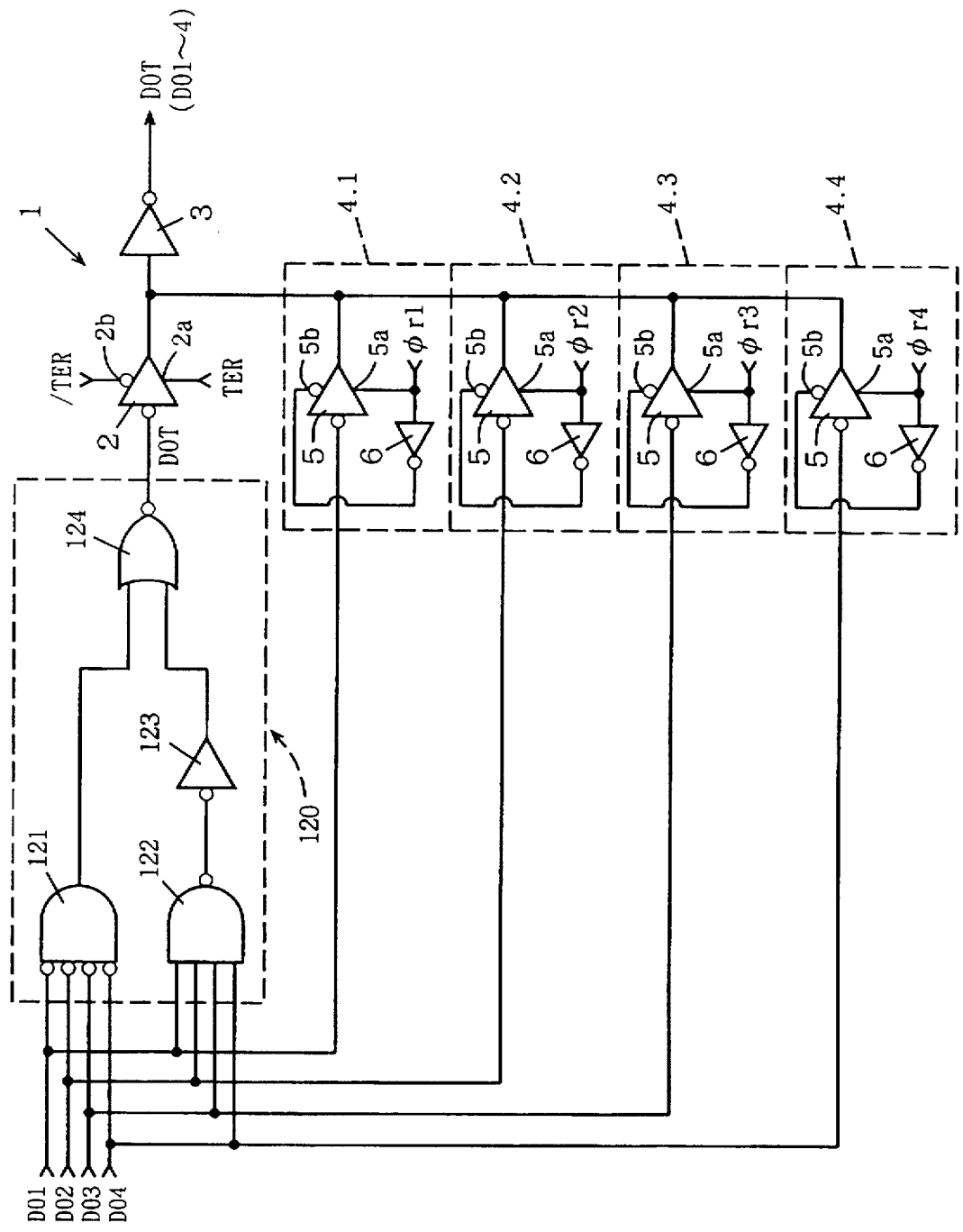
FIG. 1 is a circuit block diagram illustrating a configuration of a compression reading switch circuit of a DRAM according to the first embodiment of the invention.

FIG. 1 is a circuit block diagram showing a configuration of a main portion of a DRAM according to the first embodiment.

Figure 25:
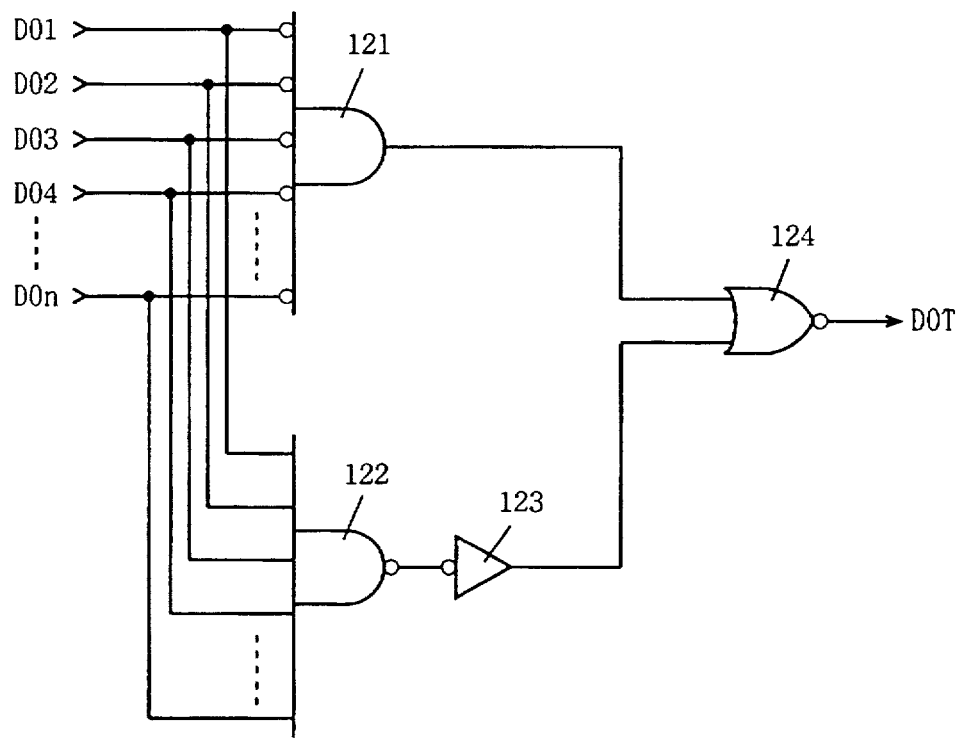
FIG. 25 is a block diagram of a partially omitted circuit illustrating a configuration of a data equality/inequality determination circuit included in the DRAM shown in FIG. 23.
Figure 26:
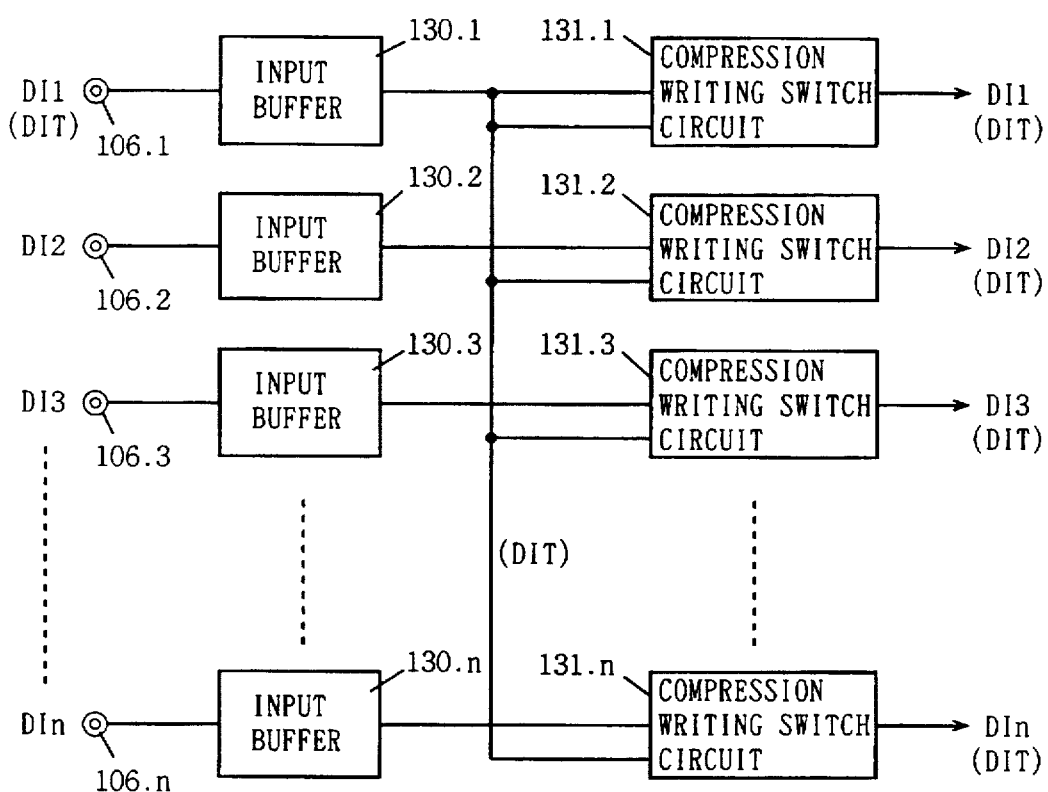
FIG. 26 is a block diagram of a partially omitted circuit illustrating a configuration of a portion related to data writing in the I/O compression mode in the DRAM shown in FIG. 23.
Figure 27:
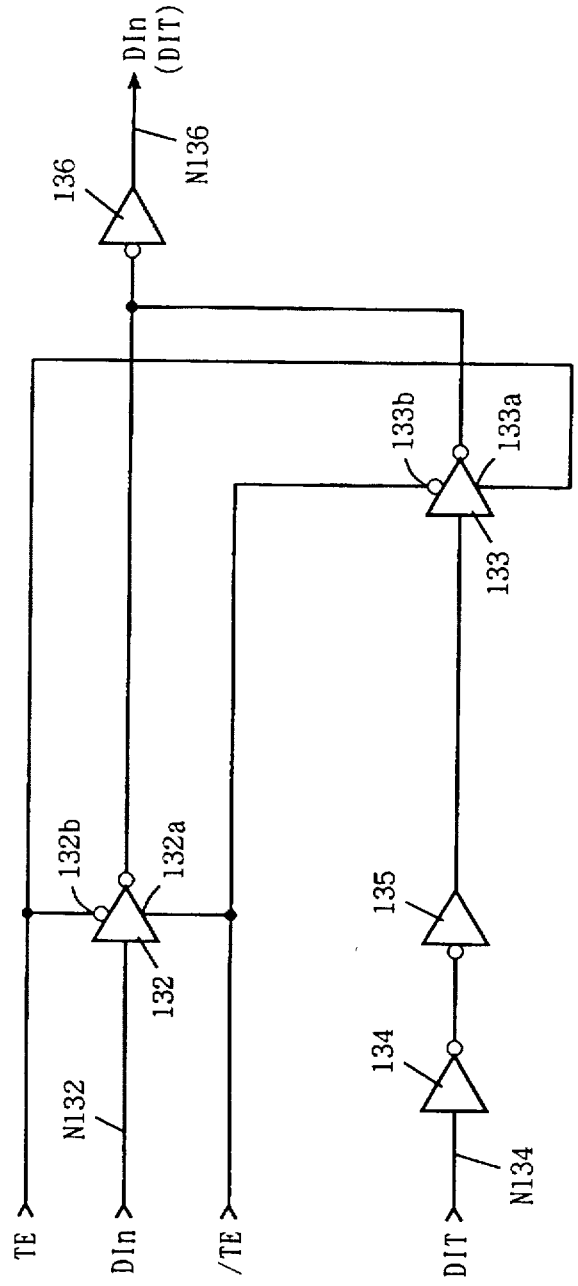
FIG. 27 is a circuit block diagram showing a configuration of the compression writing switch circuit shown in FIG. 26.

With reference to FIG. 1, a difference between the DRAM and the conventional DRAM is a newly provided compression reading switch circuit 1. Compression reading switch circuit 1 includes a switching inverter 2, an inverter 3, and gate circuits 4.1–4.4. Switching inverter 2 receives output data DOT from data equality/inequality determination circuit 120 described referring to FIG. 25 (provided n=4). Signals TER and /TER (first test signals) are supplied to a power supply node 2a and a ground node 2b of switching inverter 2 respectively.

Each of gate circuits 4.1–4.4 includes a switching inverter 5 and an inverter 6. Switching inverters 5 in gate circuits 4.1–4.4 receive read data DO1–DO4 respectively. Signals φr1–φr4 (second test signals) are directly input to supply nodes 5a of switching inverters 5 in gate circuits 4.1–4.4, and also input to ground nodes 5b of switching inverters 5 via inverters 6.

Outputs from switching inverter 2 and from switching inverters 5 in gate circuits 4.1–4.4 are both input to inverter 3. An output from inverter 3 is supplied to the test device via a compressed data input/output terminal (e.g. 106.1).

Figure 2:
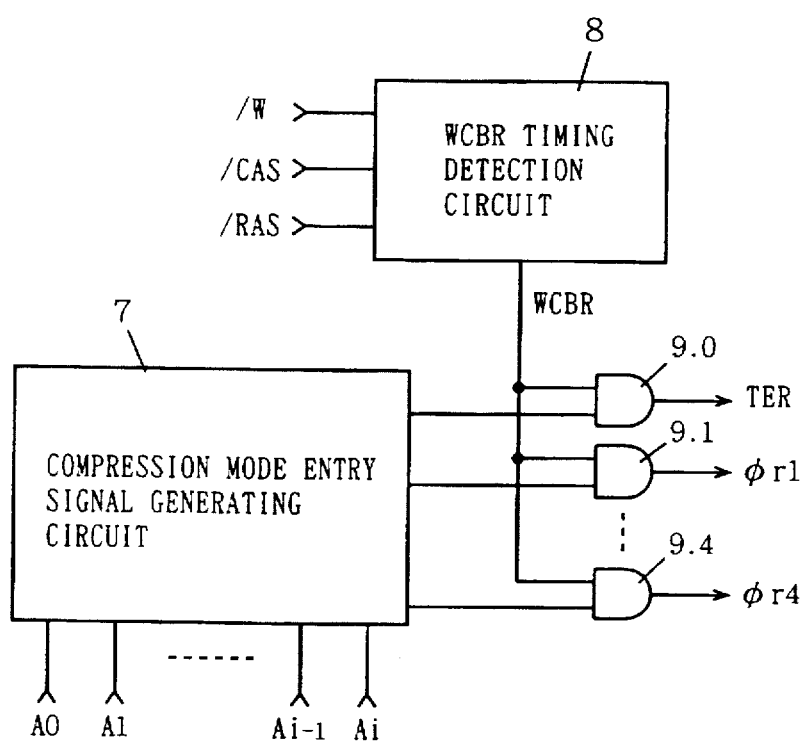
FIG. 2 is a block diagram of a partially omitted circuit for generating signals TER, φr1–φr4 shown in FIG. 1.

As shown in FIG. 2, signals TER and φr1–φr4 are generated through a compression mode entry signal generating circuit 7, a WCBR timing detection circuit 8, and AND gates 9.0–9.4. Compression entry signal generating circuit 7 decodes a combination of address signal input terminals having the super Vcc level applied thereto, generates signals TER and φr1–φr4, and provides these signals TER and φr1–φr4 respectively to one input nodes of AND gates 9.0–9.4. WCBR detection circuit 8 detects a timing of WCBR at which signal /RAS attains "L" level after signals /W and /CAS attain "L" level (/W, /CAS Before/RAS), and provides signal WCBR of "H" level to the other input nodes of AND gates 9.0–9.4. AND gates 9.0–9.4, responsive to signal WCBR provided thereto, pass output signals TER and φr1–φr4 from compression mode entry signal generating circuit 7 through compression reading switch circuit 1 in FIG. 1.

An operation of the DRAM will be described below. Entry of a normal I/O compression mode is carried out by supplying signals /W, /CAS, and /RAS at the WCBR timing and applying the super Vcc level to an input terminal of a specific address signal (e.g. A0).

At this time, signal TER attains "H" level and signals φr1–φr4 are all fixed at "L" level. Switching inverter 2 in FIG. 1 is activated and switching inverters 5 in gate circuits 4.1–4.4 are inactivated. This operation is similar to that of the conventional DRAM. The normal I/O compression mode is canceled by performing the /RAS only refresh or the /CAS Before /RAS refresh cycle after writing of data DIT and reading of data DOT in the manner similar to the conventional method, and the DRAM is reset.

In the normal I/O compression mode, although at least one of the four memory cells MC in a group can be determined to be defective, it is impossible to specify which memory cell MC is defective. A special I/O compression mode is accordingly carried out as described below.

Entry of the special I/O compression mode is performed by supplying signals /W, /CAS and /RAS at the WCBR timing and applying the super Vcc level to an input terminal of an address signal (e.g. A1) which is different from the one at the time of the entry in the normal I/O compression mode as shown in FIGS. 4A–4H. At this time, either of signals φr1–φr4 is selectively generated by changing the combination of input terminals of address signals having the super Vcc level applied thereto (e.g. A1 and A2, A2 and A3, and the like).

In the special I/O compression mode, signal TER attains "L" level and the selected signal (e.g. φr1) attains "H" level. Switching inverter 5 in gate circuit 4.1 in FIG. 1 is activated and switching inverter 2 and switching inverters 5 in gate circuits 4.2–4.4 are inactivated. Read data DO1 is thereafter read by the normal reading operation, and read data DO1 is supplied to the test device via compressed data input/output terminal 106.1. The test device reads out each of data DO1–DO4 by generating each of signals φr1–φr4 and specifies a defective memory cell among four memory cells MC by comparing each of data DO1–DO4 with write data DIT. Cancellation of the special I/O compression mode is carried out similarly to the cancellation of the normal I/O compression mode.

In the special I/O compression mode, output of read data DO1–DOn to data input/output terminals 106.1–106.n is also inhibited in order to avoid confliction between data at data input/output terminals 106.1–106.n.

According to this embodiment, compression reading switch circuit 1 is provided for selectively passing any of output data DOT from data equality/inequality determination circuit 120 and read data DO1–DO4 through data input/output terminal 106.1 in the I/O compression mode. Accordingly, it is possible to specify which memory cell is defective in a defective group by determining data output to data input/output terminal 106.1.

(Second Embodiment)

Figure 5:
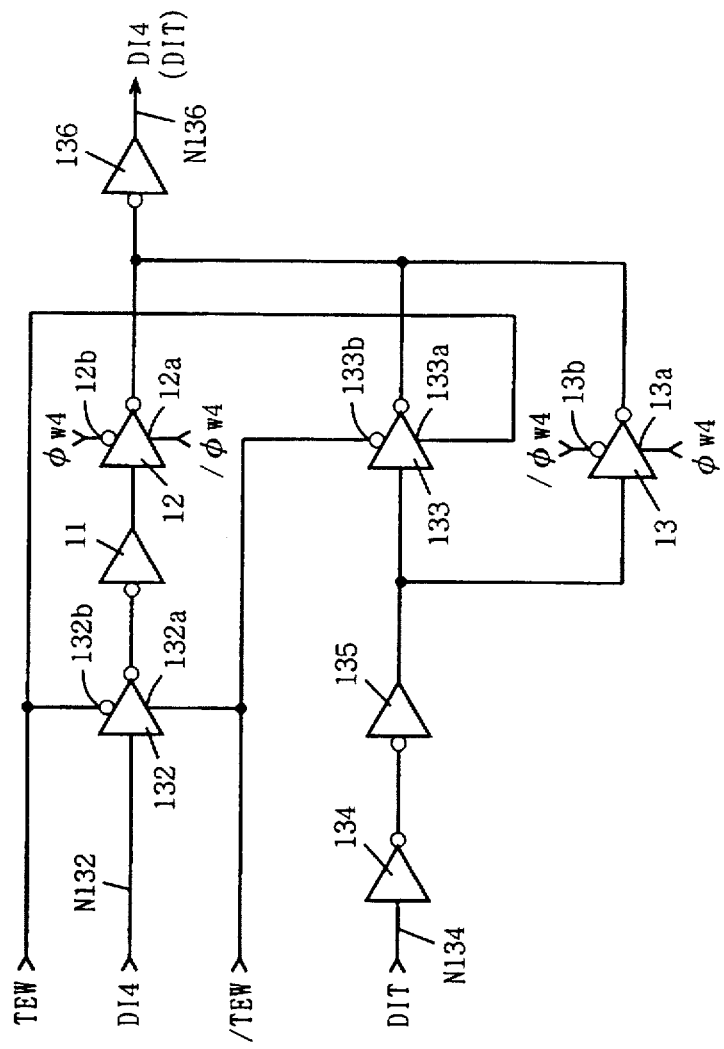
FIG. 5 is a circuit block diagram showing a configuration of a compression writing switch circuit of a DRAM according to the second embodiment of the invention.
Figure 6:
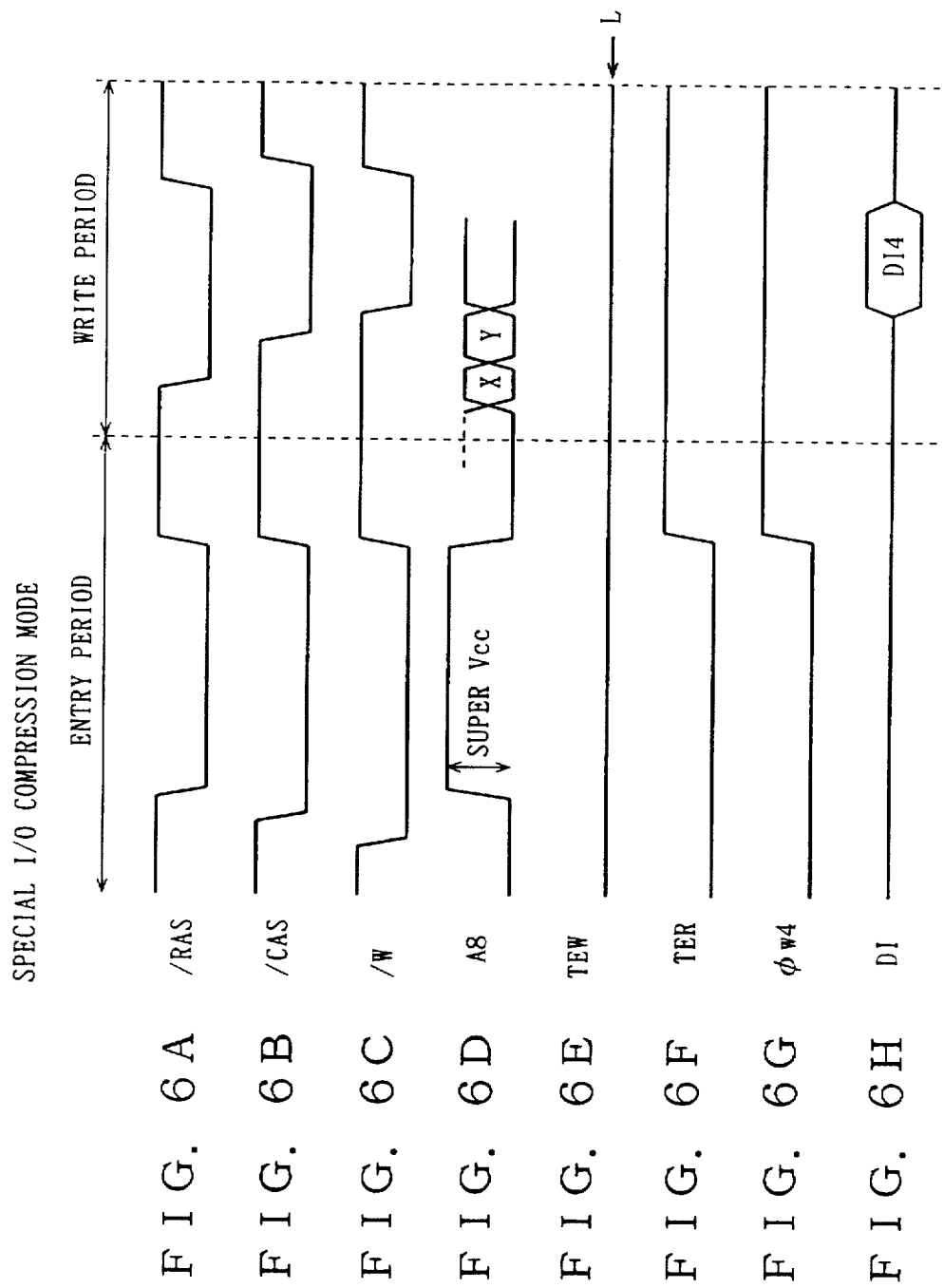
FIGS. 6A–6H are timing charts showing an operation in the special I/O compression mode in the compression writing switch circuit in FIG. 5.

FIG. 5 is a circuit block diagram showing a main portion of a DRAM according to the second embodiment.

Referring to FIG. 5, the difference between the DRAM and the one in the first embodiment is that compression writing switch circuits 131.1–131.4 are replaced with compression writing switch circuits 10.1–10.4. Different from compression writing switch circuit 131.4, compression writing switch circuit 10.4 further includes an inverter 11 and switching inverters 12 and 13. Inverter 11 and switching inverter 12 are connected in series between switching inverter 132 and inverter 136. Signals φw4 and φw4 are respectively supplied to supply nodes 12a and 13a of switching inverters 12 and 13. Signals φw4 and φw4 are respectively supplied to ground nodes 12b and 13b of switching inverters 12 and 13. Instead of signals TE and /TE, signals TEW and /TEW are supplied to switching inverters 132 and 133. Signals TEW and φw1–φw4 are produced similarly to signals TER and φr1–φr4 in the circuit described in conjunction with FIG. 2. Compression writing switch circuits 10.1–10.3 also have similar configurations.

Figure 3:
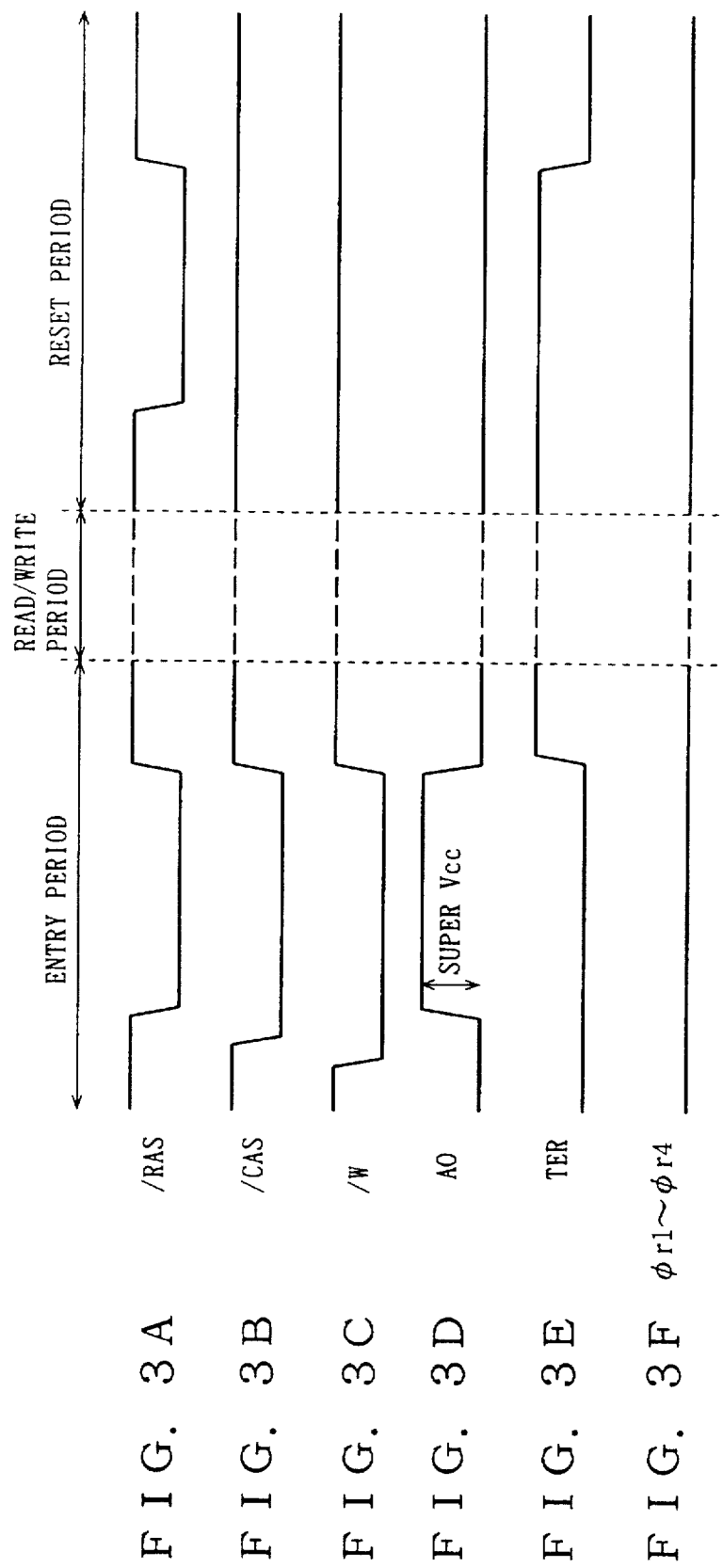
FIGS. 3A–3F are timing charts showing an operation in the normal I/O compression mode in the compression reading switch circuit shown in FIG. 1.
Figure 4:
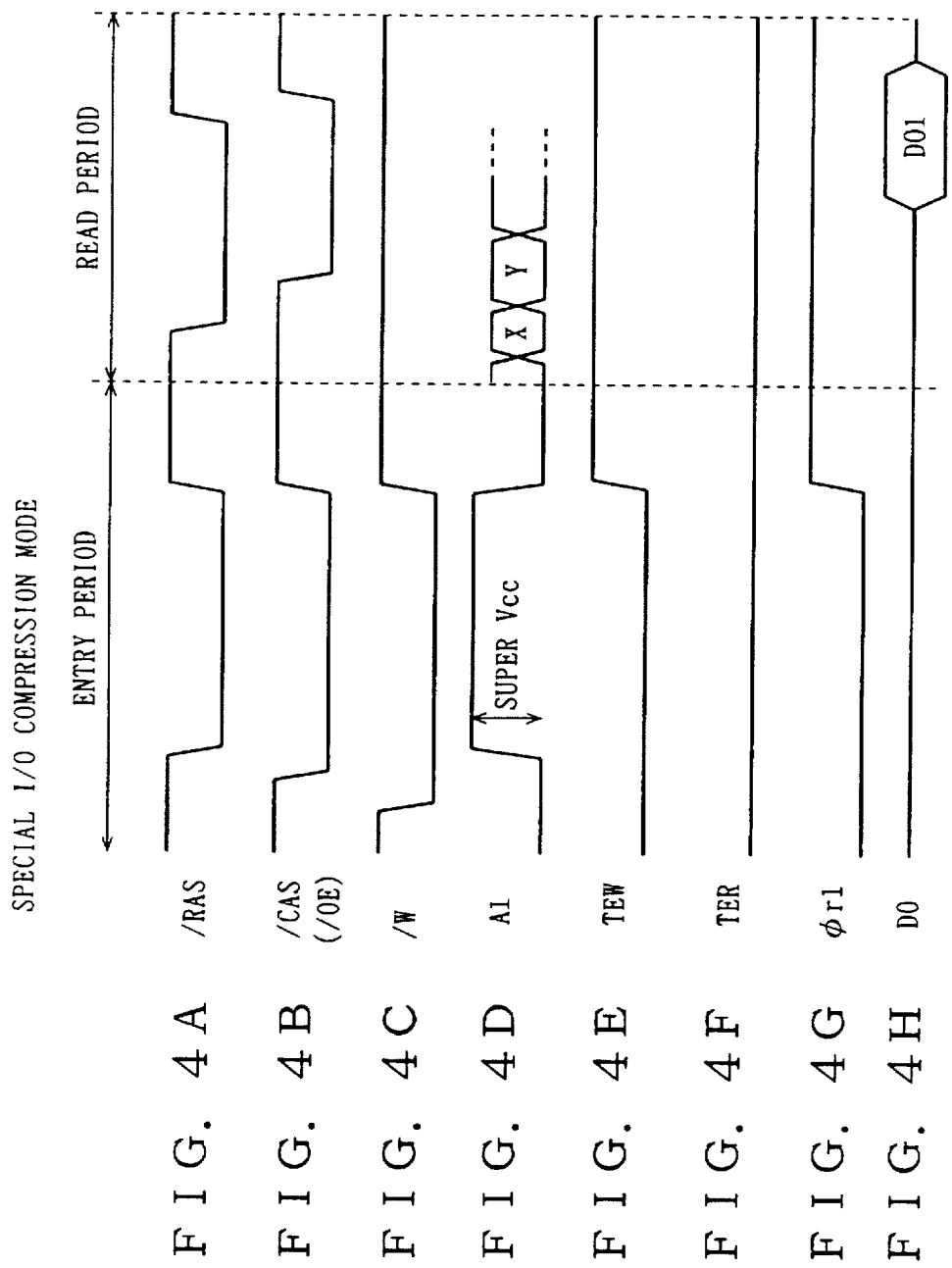
FIGS. 4A–4H are timing charts showing an operation in the special I/O compression mode in the compression reading switch circuit shown in FIG. 1.

Next, an operation of the DRAM will be described. Entry of the normal I/O compression mode is carried out in the manner similar to that shown in FIG. 3. In this mode, signal TEW attains "H" level and signals φw1–φw4 are fixed at "L" level. Switching inverter 133 in FIG. 5 is activated and switching inverters 12, 13, and 132 are inactivated. In this case, the same data DIT are written in parallel into four memory cells MC in a selected group from one data input/output terminal 106.1.

9

In the normal I/O compression mode, only the same data can be written into four memory cells MC in the selected group. Therefore, when different data are written into two memory cells MC adjacent to each other, the degree of interference cannot be tested. Accordingly, the special I/O compression mode is performed as described below.

Entry of the special I/O compression mode is carried out by providing signals /W, /CAS, and /RAS at the WCBR timing and applying the super Vcc level to the input terminal of a specific address signal (e.g. A8) as shown in FIGS. 6A–6H. At this time, any of signals φw1–φw4 is selectively produced by changing combination of input terminals of the address signals to which the super Vcc level is applied.

In the special I/O compression mode, signal TEW attains "L" level and a selected signal, for example φw4, attains "H" level. Switching inverters 13 and 132 are activated and switching inverters 12 and 133 are inactivated in FIG. 5. According to the normal writing operation, write data DIT is thereafter supplied to memory cell MC.

The test device generates each of signals φw1–φw4 and writes data into four memory cells MC in the selected group such that adjacent memory cells have different data. The test device further reads each of the data in the four memory cells using compression reading switching circuit 1 in FIG. 1 and determines the degree of interference between two memory cells MC adjacent to each other based on the result of the reading.

According to this embodiment, compression writing switch circuits 10.1–10.4 are provided for writing data independently into each of four memory cells MC in the selected group from data input/output terminal 106.1 in the I/O compression mode. Accordingly, the degree of interference between two adjacent memory cells MC can be tested by writing data different from each other into the two adjacent memory cells MC respectively.

(Third Embodiment)

In a DRAM according to the third embodiment, five cycles in the page mode are utilized. Reading/writing in the normal I/O compression mode is performed in the first cycle, and reading/writing in the special I/O compression mode is performed in the next four cycles.

Figure 7:
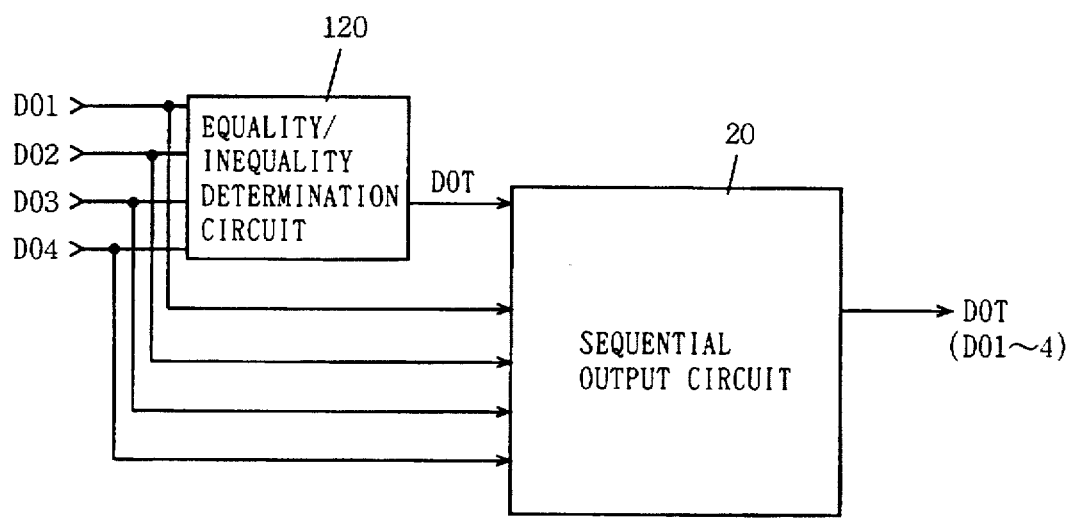
FIG. 7 is a circuit block diagram showing a configuration of a portion related to data reading in the I/O compression mode of a DRAM according to the third embodiment of the invention.
Figure 8:
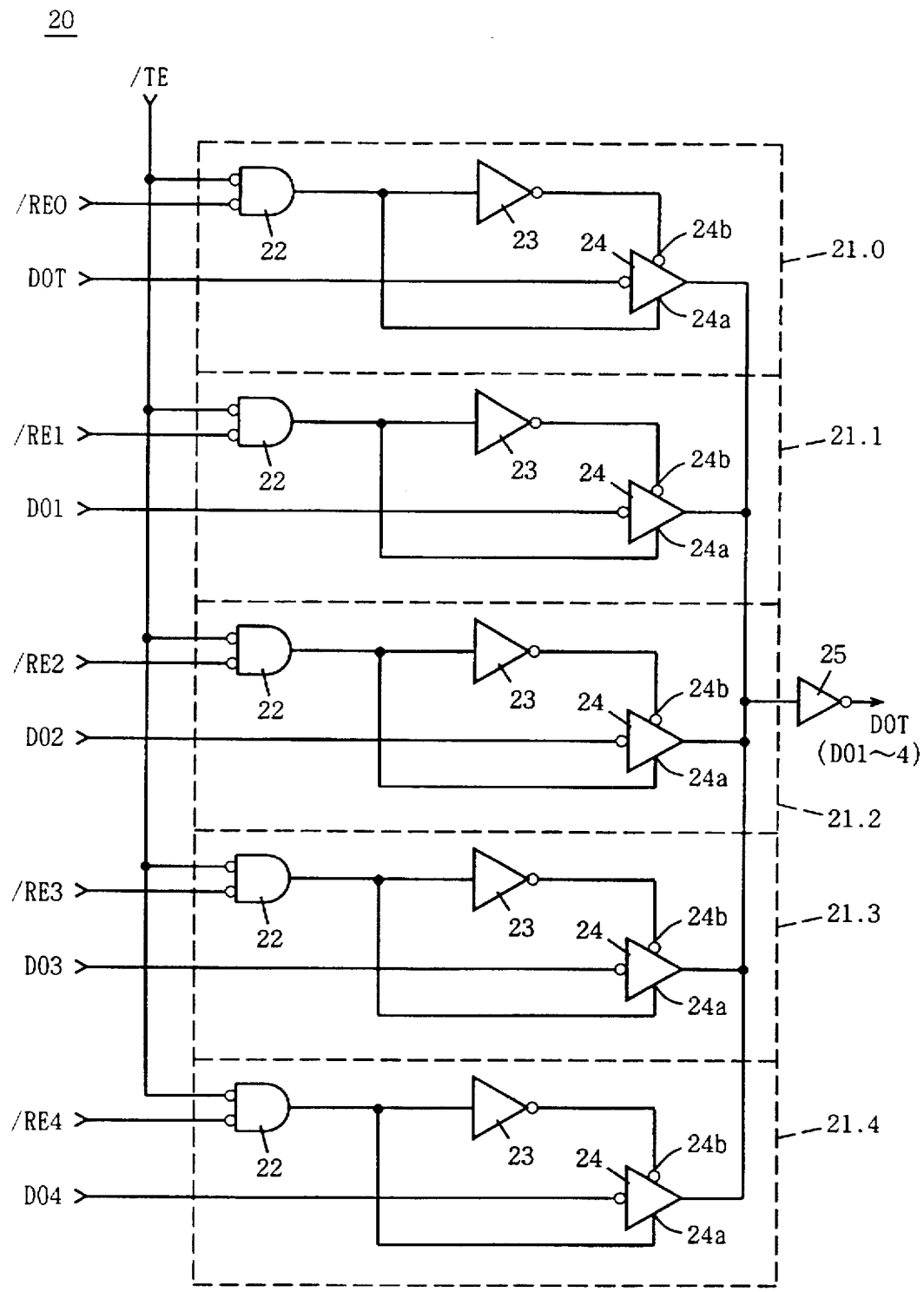
FIG. 8 is a circuit block diagram showing a configuration of a sequential output circuit shown in FIG. 7.
Figure 9:
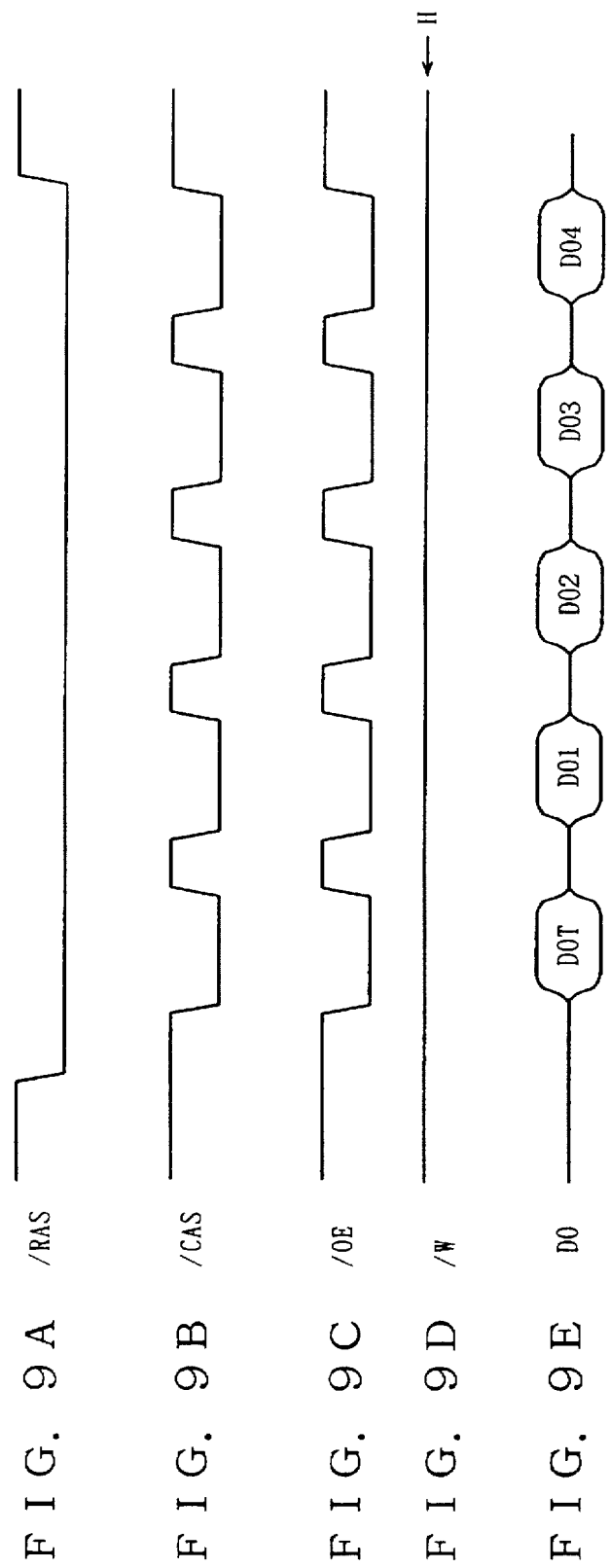
FIGS. 9A–9E are timing charts showing an operation of the sequential output circuit shown in FIG. 8.

As shown in FIG. 7, a sequential output circuit 20 is provided between data equality/inequality determination circuit 120 and compressed data input/output terminal 106.1. As shown in FIG. 8, sequential output circuit 20 includes five gate circuits 21.0–21.4 and an inverter 25. Each of gate circuits 21.0–21.4 includes an NOR gate 22, an inverter 23, and a switching inverter 24.

One input nodes of NOR gates 22 in gate circuits 21.0–21.4 receive signal /TE. The other input nodes of NOR gates 22 in gate circuits 21.0–21.4 respectively receive signals /RE0–/RE4. Signal /TE attains "L" level in the I/O compression mode. Signals /RE0–/RE4 attain "L" level sequentially one by one in synchronization with signal /CAS.

An output from NOR gate 22 is supplied to a ground node 24b of switching inverter 24 via inverter 23 and also directly supplied to a supply node 24a of switching inverter 24. Switching inverters 24 in gate circuits 21.0–21.4 respectively receive data DOT and DO1–DO4. Outputs from switching inverters 24 in gate circuits 21.0–21.4 are all supplied to inverter 25. An output from inverter 25 is provided to the test device via data input/output terminal 106.1.

When signal /TE attains "L" level after the entry of the I/O compression mode, NOR gates 22 in gate circuits

10

21.0–21.4 respectively operate as inverters for signals /RE0–/RE4. As shown in FIGS. 9A–9E, when logic levels of signals /CAS and /OE change after signal /RAS falls to "L" level, signals /RE0–/RE4 attain "L" level sequentially one by one in synchronization with signal /CAS, so that switching inverters 24 in gate circuits 21.0–21.4 are sequentially activated one by one and data DOT and DO1–DO4 are sequentially output one by one.

Figure 10:
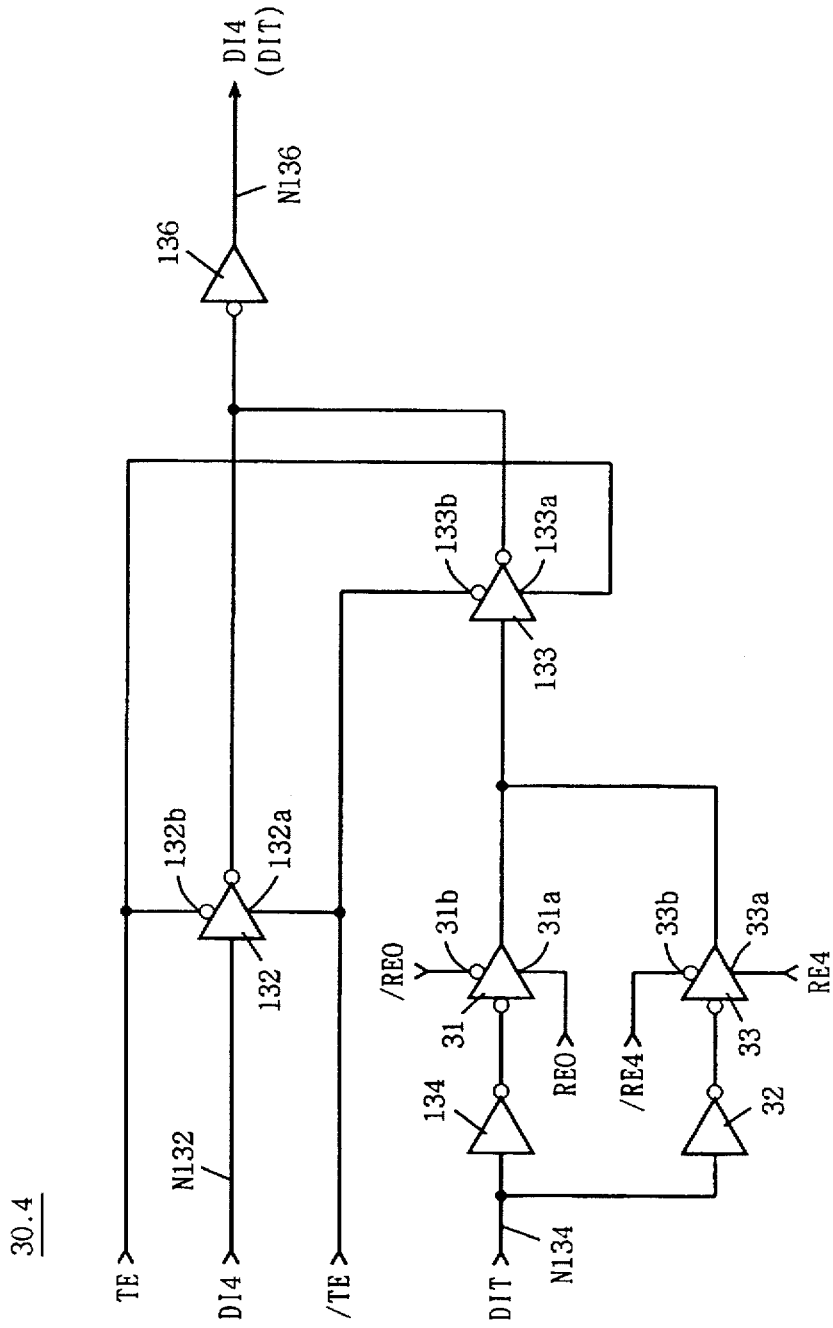
FIG. 10 is a circuit block diagram showing a configuration of a compression writing switch circuit included in the DRAM described referring to FIG. 7.
Figure 11:
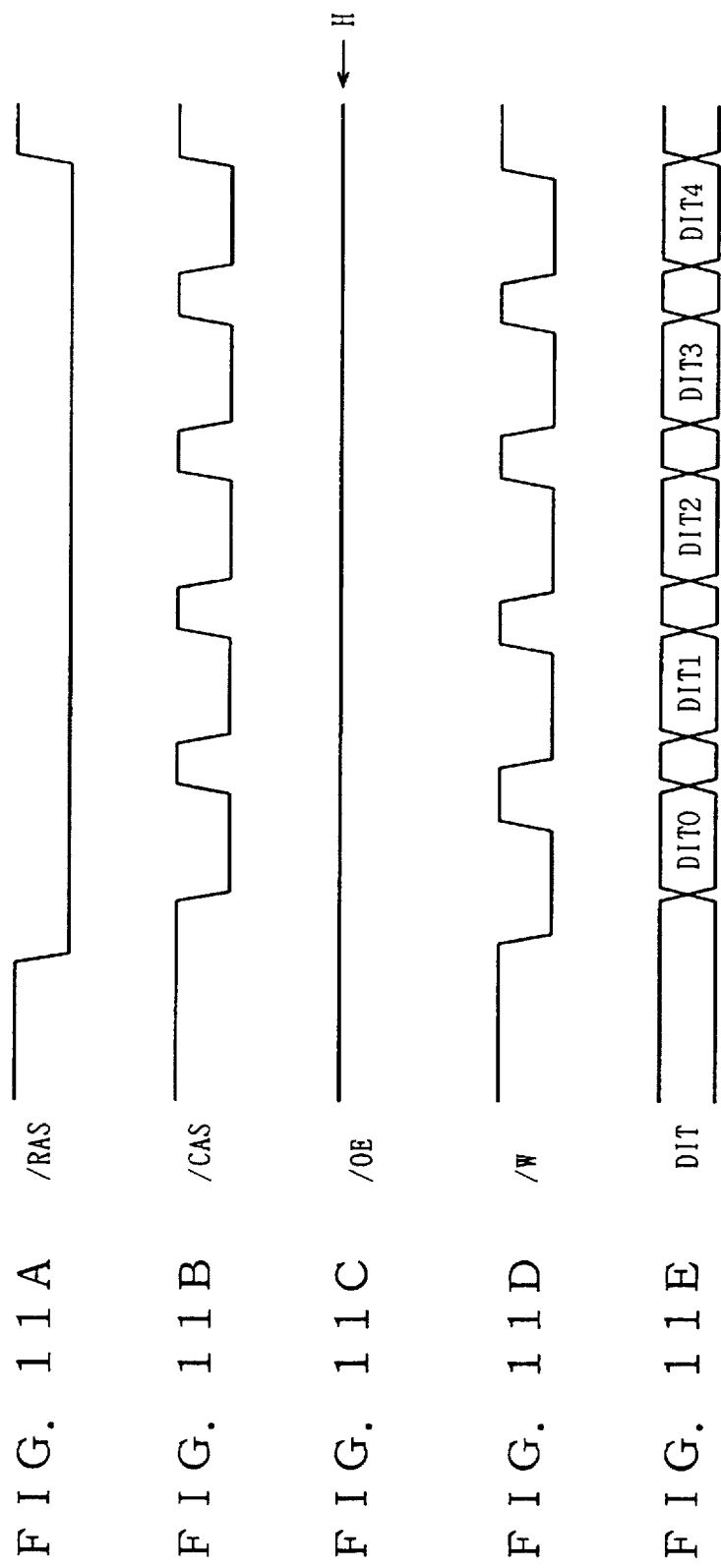
FIGS. 11A–11E are timing charts showing an operation of the compression writing switch circuit shown in FIG. 10.

In the DRAM, compression writing switch circuits 131.1–131.n (n=4) are replaced with compression writing switch circuits 30.1–30.4 shown in FIG. 10. In compression writing switch circuit 30.4, inverter 135 in compression writing switch circuit 131.n (n=4) is replaced with a switching inverter 31, and an inverter 32 and a switching inverter 33 connected in series are newly provided. The serially connected inverter 32 and switching inverter 33 are connected in parallel with serially connected inverter 134 and switching inverter 31. Signals RE0 and /RE0 are respectively supplied to a supply node 31a and a ground node 31b of switching inverter 31. Signals RE4 and /RE4 are respectively provided to a supply node 33a and a ground node 33b of switching inverter 33.

When signal /TE attains "L" level after the entry of the I/O compression mode, switching inverters 133 are activated and switching inverters 132 are inactivated in compression writing switch circuits 30.1–30.4. As shown in FIGS. 11A–11E, when logic levels of signals /CAS and /W change after signal /RAS falls to "L" level, signals /RE0–RE4 sequentially attain "L" level one by one in synchronization with signal /CAS. After activation of switching inverters 31 in compression writing switch circuits 30.1–30.4, switching inverters 33 in compression writing switch circuits 30.1–30.4 are sequentially activated one by one and test data DIT0–DIT4 are sequentially written.

Figure 12:
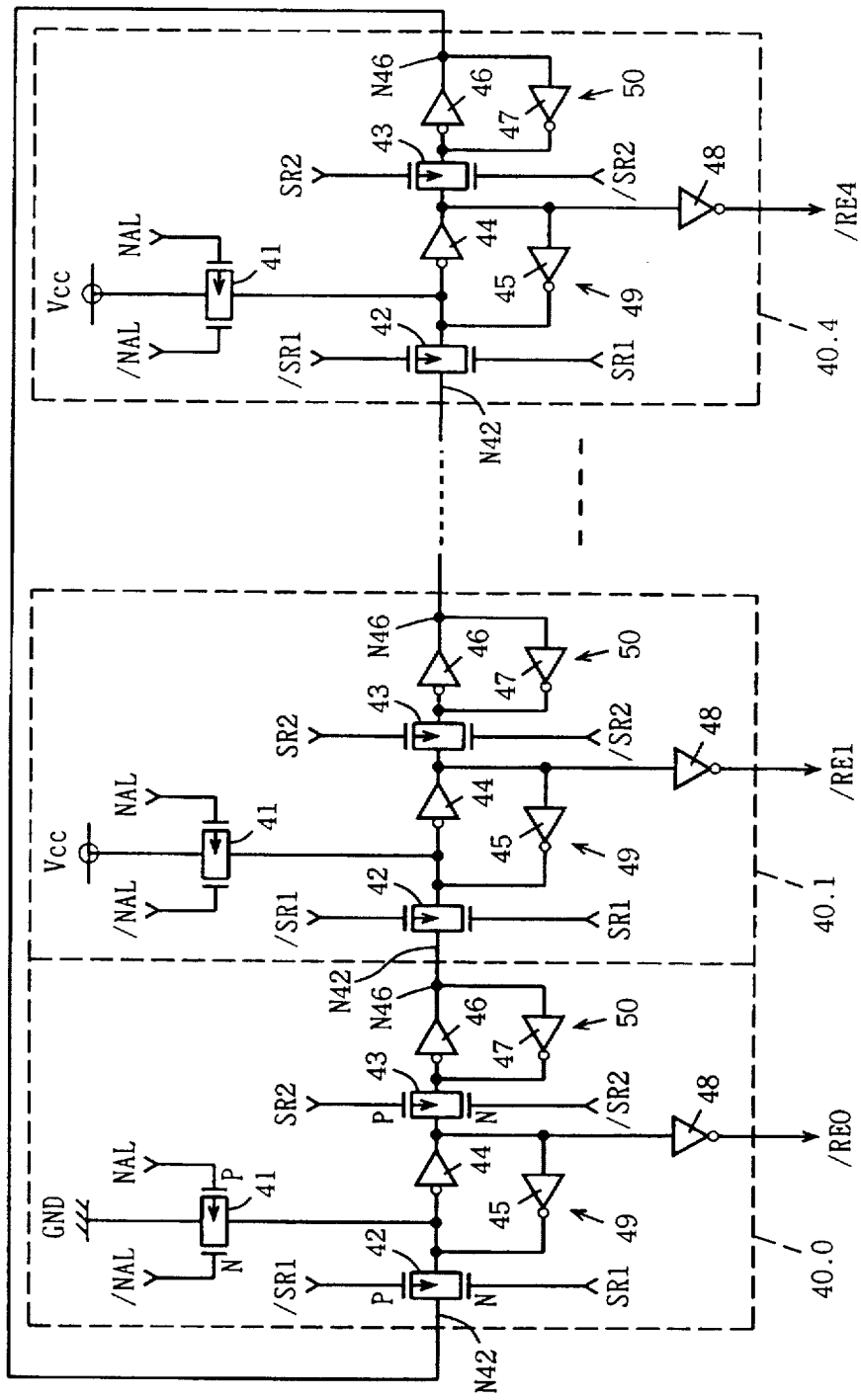
FIG. 12 is a block diagram of a partially omitted circuit illustrating configuration of a signal generating circuit included in the DRAM shown in FIG. 7.
Figure 13:
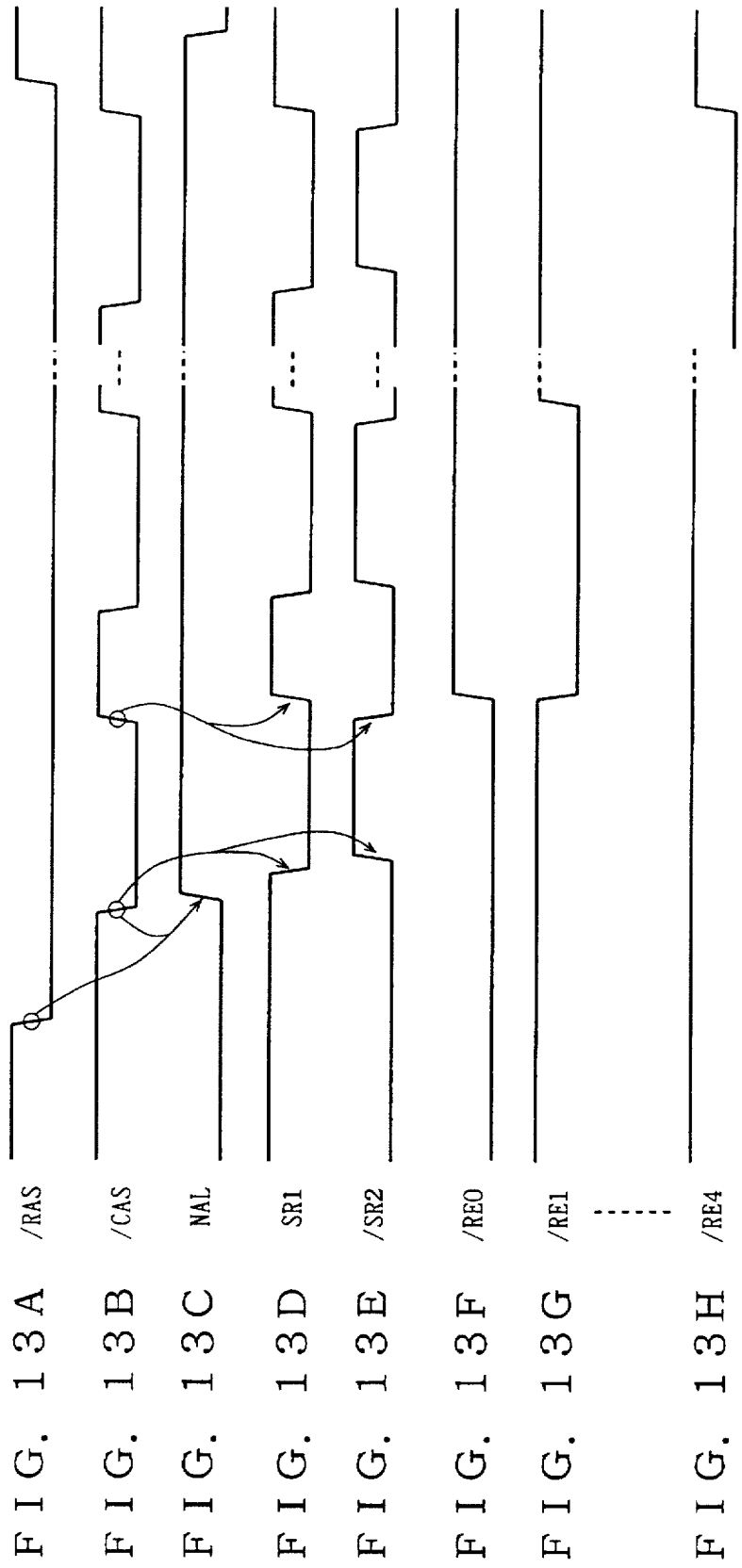
FIGS. 13A–13H are timing charts showing an operation of the signal generating circuit shown in FIG. 12.

FIG. 12 is a block diagram of a partially omitted circuit illustrating a configuration of a signal generating circuit in which signals /RE0–/RE4 sequentially attain "L" level one by one in synchronization with signal /CAS.

With reference to FIG. 12, the signal generating circuit includes shift circuits 40.0–40.4 respectively provided corresponding to signals /RE0–/RE4. Shift circuits 40.0–40.4 are connected in a ring form.

Shift circuit 40.0 includes transfer gates 41–43 and inverters 44–48. Transfer gate 42, inverter 44, transfer gate 43, and inverter 46 are connected in series between an input node N42 and an output node N46. Inverters 45 and 47 are respectively connected in parallel with inverters 44 and 46 in the direction opposite to each other. Inverters 44 and 45, and inverters 46 and 47 respectively constitute latch circuits 49 and 50. Transfer gate 41 is connected between a line receiving ground potential GND and an input node of latch circuit 49. An output from latch circuit 49 is supplied to inverter 48, and an output from an inverter 48 is signal /RE0. Gates of transfer gate 41 at the side of the P channel MOS transistor and of the N channel MOS transistor respectively receive signals NAL and /NAL. Gates of transfer gate 42 at the side of the P channel MOS transistor and of the N channel MOS transistor respectively receive signals /SR1 and SR1. Gates of transfer gate 43 at the side of the P channel MOS transistor and of the N channel MOS transistor respectively receive signals SR2 and /SR2.

Each of shift circuits 40.1–40.4 has a structure similar to shift circuit 40.0 except that transfer gate 41 is connected between a line receiving supply potential Vcc and an input node of latch circuit 49, and that outputs from inverters 48 are respectively signals /RE1–/RE4.

An operation of the signal generating circuit will be described below. As shown in FIGS. 13A-13H, in the initial state, signals NAL, /SR1, and /SR2 are all at "L" level, so that transfer gates 41 and 42 are turned on, and transfer gate 43 is turned off. At this time, signal /RE0 is at "L" level and signals /RE1-/RE4 are at "H" level.

After signal /RAS falls to "L" level, responsive to the first falling of signal /CAS, signals NAL and /SR2 rise to "H" level and signal SR1 falls to "L" level. Transfer gates 41 and 42 are turned off and transfer gate 43 is turned on. Accordingly, an output from latch circuit 49 is transmitted to a latch circuit 50 and an output from latch circuit 50 attains "L" level.

When signal /CAS rises, signals SR1 and /SR2 are inverted to become "H" level and "L" level respectively. Transfer gate 42 is turned on and transfer 43 is turned off. Accordingly, outputs from latch circuits 50 in shift circuits 40.0–40.4 in the pre-stage are respectively transmitted to latch circuits 49 in shift circuits 40.1–40.3 and 40.0 in the post-stage. Signal /RE1 then attains "L" level and signals /RE2–/RE4, and /RE0 attain "H" level. Each time signal /CAS rises from "L" level to "H" level, a signal of "L" level is transmitted from the shift circuit in the pre-stage to the shift circuit in the post-stage. Accordingly, signals /RE0–/RE4 attain sequentially to "L" level one by one in synchronization with signal /CAS.

According to this embodiment, an effect similar to those of the first and second embodiments can be obtained. Further, the test operation can be simplified since reading of data DOT and DO1–DO4 and writing of data DIT0–DIT4 can be carried out successively in sequential manner in the I/O compression mode.

(Fourth Embodiment)

A DRAM according to the fourth embodiment is a modification of the DRAM of the third embodiment. In the fourth embodiment, according to input data DIT in the first cycle of the five cycles in the page mode, subsequent operations are determined.

Figure 14:
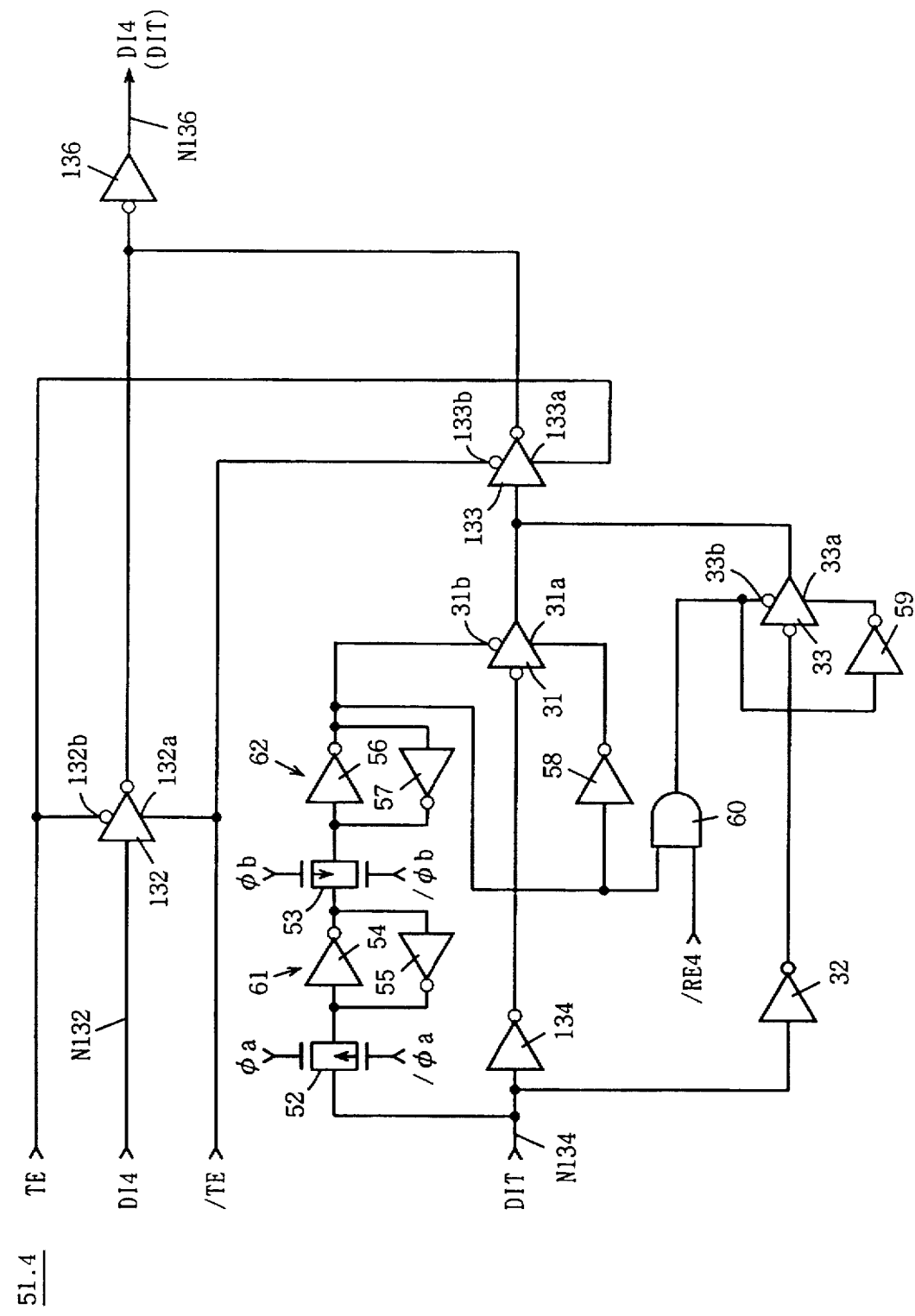
FIG. 14 is a circuit block diagram illustrating a configuration of a compression writing switch circuit of DRAM according to the fourth embodiment of the invention.
Figure 15:
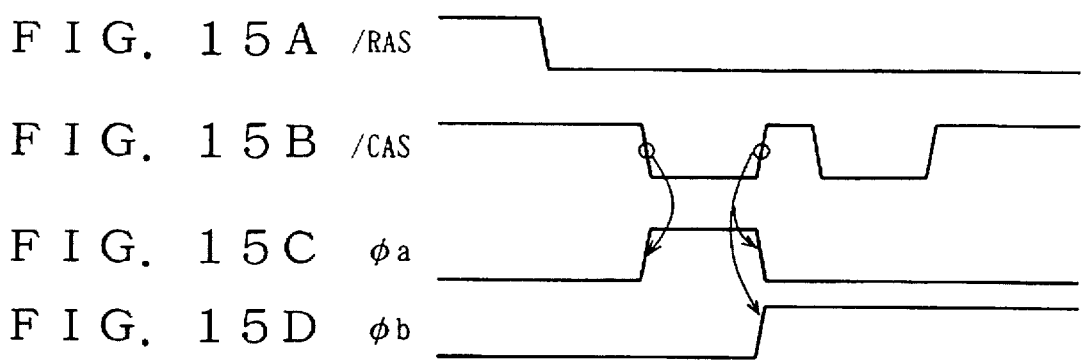
FIGS. 15A–15D are timing charts showing signals φa, and φb in the compression writing switch circuit in FIG. 14.
Figure 16:
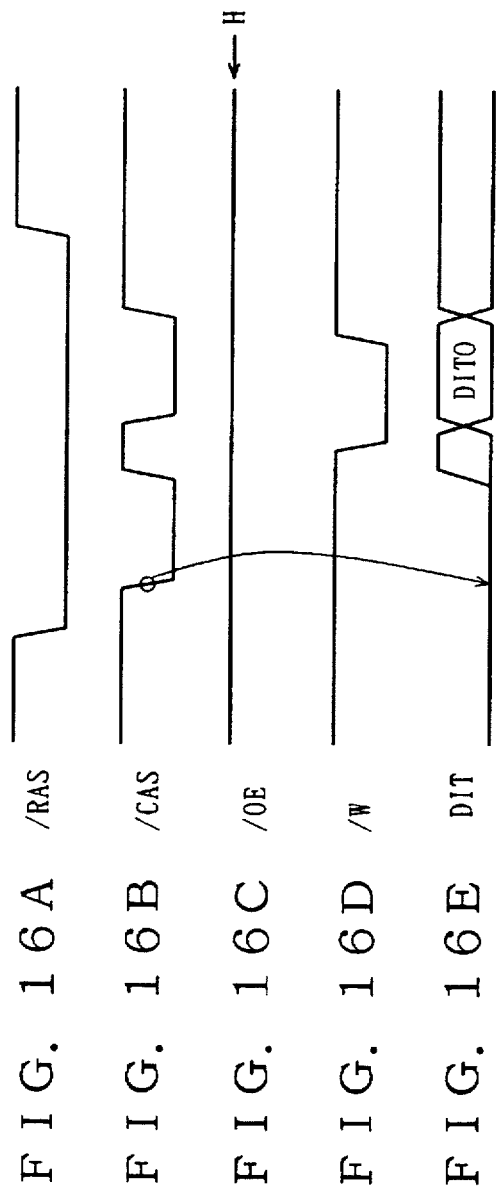
FIGS. 16A–16E are timing charts showing an operation of the compression writing switch circuit illustrated in FIG. 14.
Figure 17:
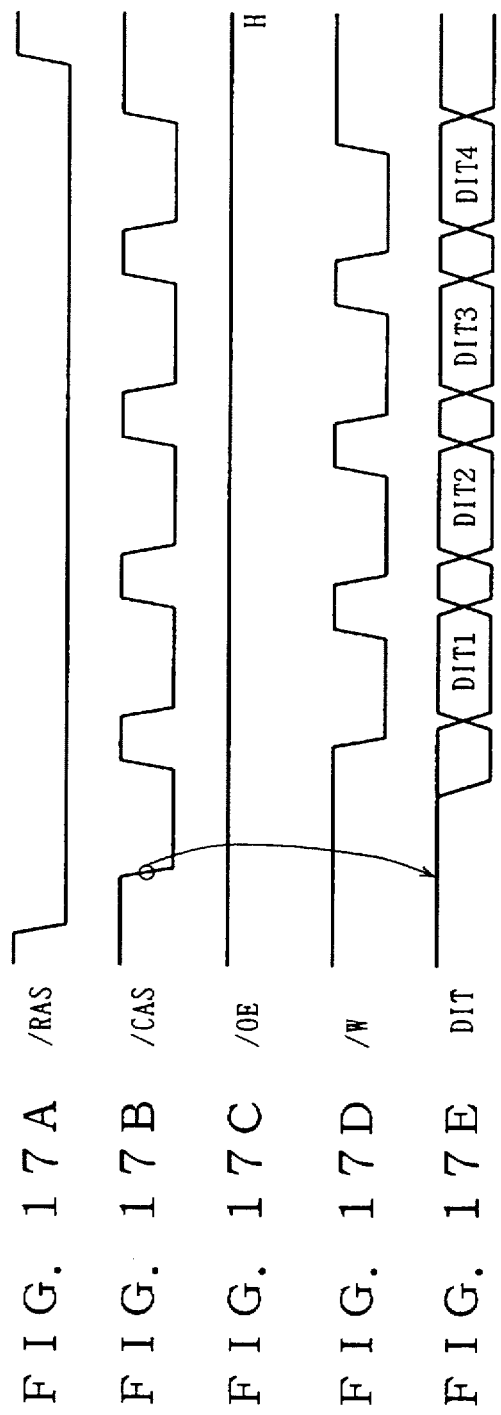
FIGS. 17A–17E are other timing charts showing an operation of the compression writing switch circuit shown in FIG. 14.

In the DRAM, compression writing switch circuits 30.1–30.4 described in conjunction with FIG. 10 are replaced with compression writing switch circuits 51.1–51.4. As shown in FIG. 14, compression writing switch circuit 51.4 further includes transfer gates 52 and 53, inverters 54–59, and an AND gate 60 in addition to the components of compression writing switch circuit 30.4. Transfer gate 52, inverter 54, transfer gate 53 and inverter 56 are connected in series between an input node N134 and a ground node 31b of switching inverter 31. Inverters 55 and 57 are respectively connected in parallel with inverters 54 and 56 in the opposite directions. Inverters 54 and 55, and inverters 56 and 57 respectively constitute latch circuits 61 and 62.

Gates of transfer gate 52 at the side of the P channel MOS transistor and of the N channel MOS transistor respectively receive signals /φa and φa. Gates of transfer gate 53 at the side of the P channel MOS transistor and of the N channel MOS transistor respectively receive signals φb and /φb. Inverter 58 is connected between ground node 31b and supply node 31a of switching inverter 31. Inverter 59 is connected between ground node 33b and supply node 33a of switching inverter 33. AND gate 60 receives signal /RE4 and an output from latch circuit 62, and an output from AND gate 60 is supplied to ground node 33b of switching inverter 33.

Next an operation of the DRAM is described. When signal /TE attains "L" level after the entry of the I/O compression mode, switching inverter 133 is activated and switching inverter 132 is inactivated. When signal /CAS falls after signal /RAS falls to "L" level, signal φa rises to "H" level and transfer gate 52 is turned on as shown in FIGS. 15A–15D. Accordingly, data DIT is latched by latch circuit 61.

When signal /CAS thereafter rises, signal φa falls to "L" level and signal φb rises to "H" level. Transfer gate 52 is then turned off and transfer gate 53 is turned on. An output from latch circuit 61 is accordingly transmitted to latch circuit 62. As a result, data DIT at the first falling of signal /CAS is latched and supplied to ground node 31b of switching inverter 31 as well as to one input node of AND gate 60.

If data DIT at the first falling of signal /CAS is "L" level, switching inverter 31 is activated, an output from AND gate 60 attains "L" level, and switching inverter 33 is activated. In this case, the same data DIT0 are written into four memory cells MC in the selected group in parallel as shown in FIGS. 16A–16E.

If data DIT at the first falling of signal /CAS is "H" level, switching inverter 31 is inactivated and AND gate 60 passes signal /RE4 through ground node 33b of switching inverter 33. As shown in FIGS. 17A–17E, data DIT1–DIT4 are sequentially written into four memory cells MC in the selected group in synchronization with signal /CAS.

It is noted that signal /W is fixed at "H" level at the input of the first data DIT such that the first input data DIT is not written into memory cell MC.

Figure 18:
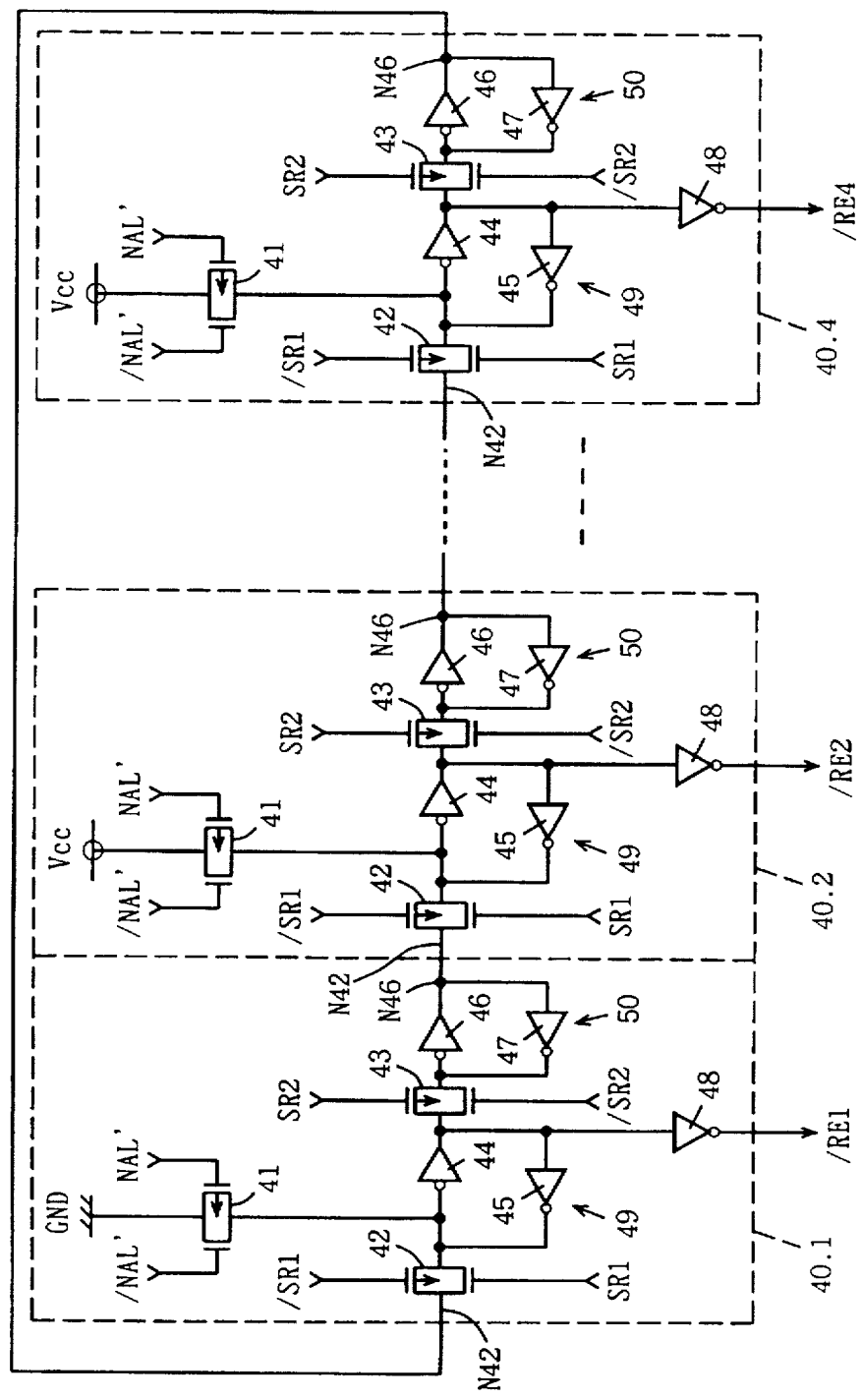
FIG. 18 is a block diagram of a partially omitted circuit illustrating a configuration of a signal generating circuit for producing signals /RE1–/RE4 used in the compression writing switch circuit in FIG. 14.
Figure 19:
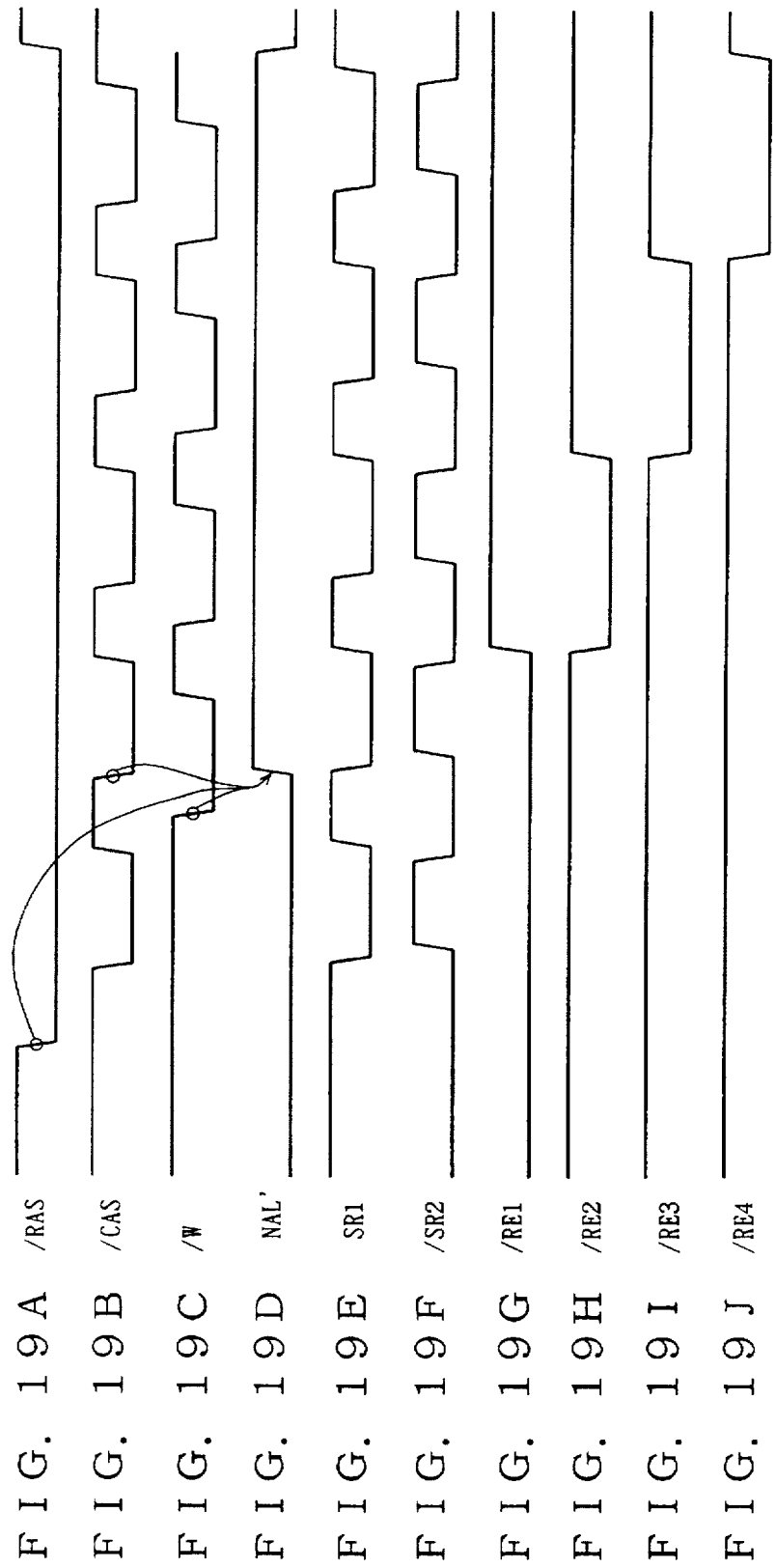
FIGS. 19A–19J are timing charts showing an operation of the signal generating circuit illustrated in FIG. 18.

FIG. 18 is a block diagram of a partially omitted circuit illustrating a configuration of a signal generating circuit in which signals /RE1–/RE4 sequentially attain "L" level one by one in synchronization with signal /CAS.

Referring to FIG. 18, the difference between the signal generating circuits in FIG. 18 and FIG. 12 is that shift circuit 40.0 is removed and signal NAL is replaced with signal NAL' in FIG. 18.

As shown in FIGS. 19A–19J, signal NAL' rises to "H" level responsive to the second rising of signal /CAS. Accordingly, start of the page operation in the first cycle is prevented. Other operations are similar to those in the signal generating circuit in FIG. 12 and the description thereof is not repeated.

According to this embodiment, an effect similar to that of the third embodiment can be obtained. In addition, the phase of the test operation can be simplified since input data DIT in the first cycle of the five cycles in the page mode determines subsequent operation modes.

(Fifth Embodiment)

Figure 20:
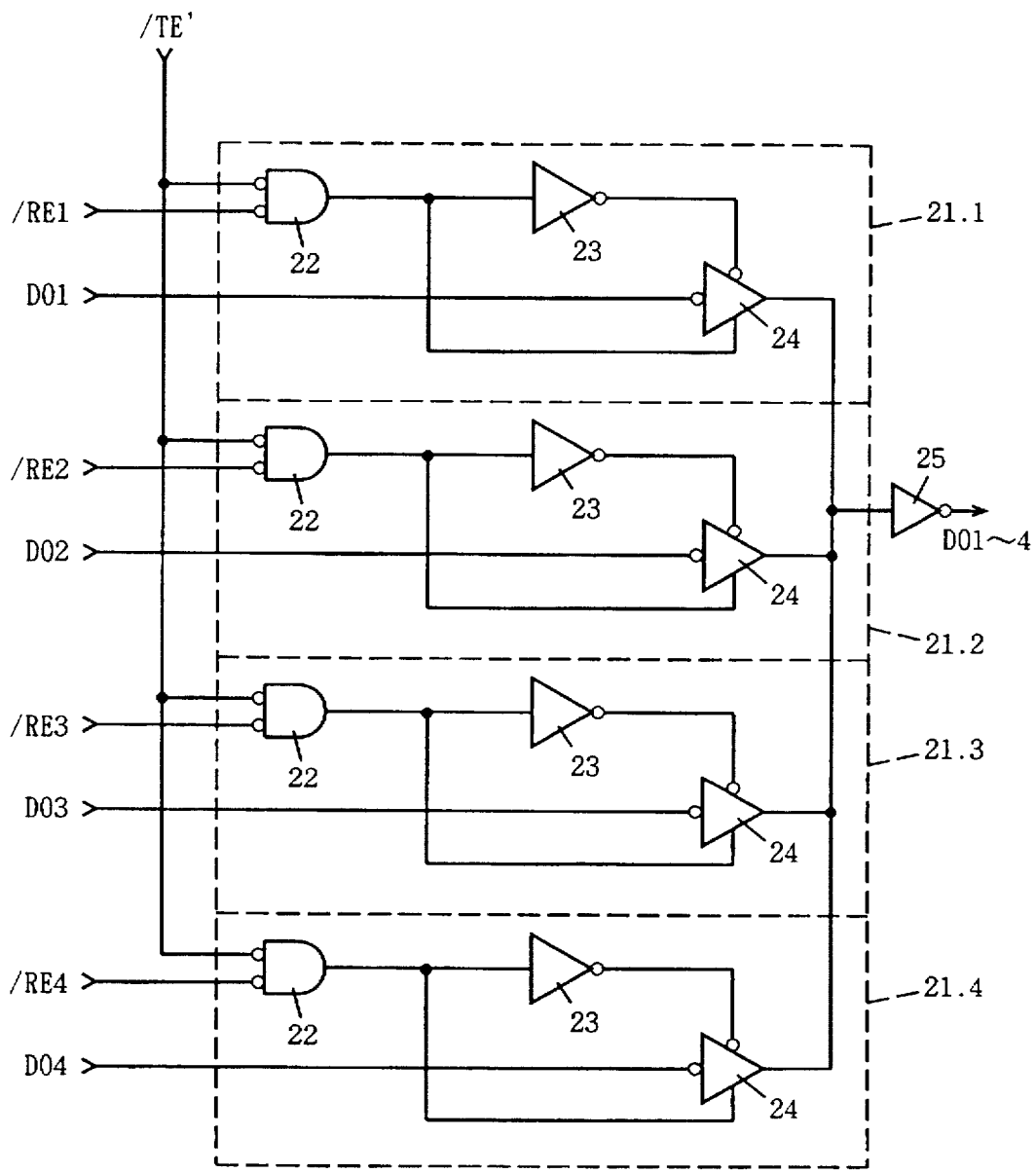
FIG. 20 is a circuit block diagram showing a configuration of a sequential output circuit of a DRAM according to the fifth embodiment of the invention.
Figure 21:
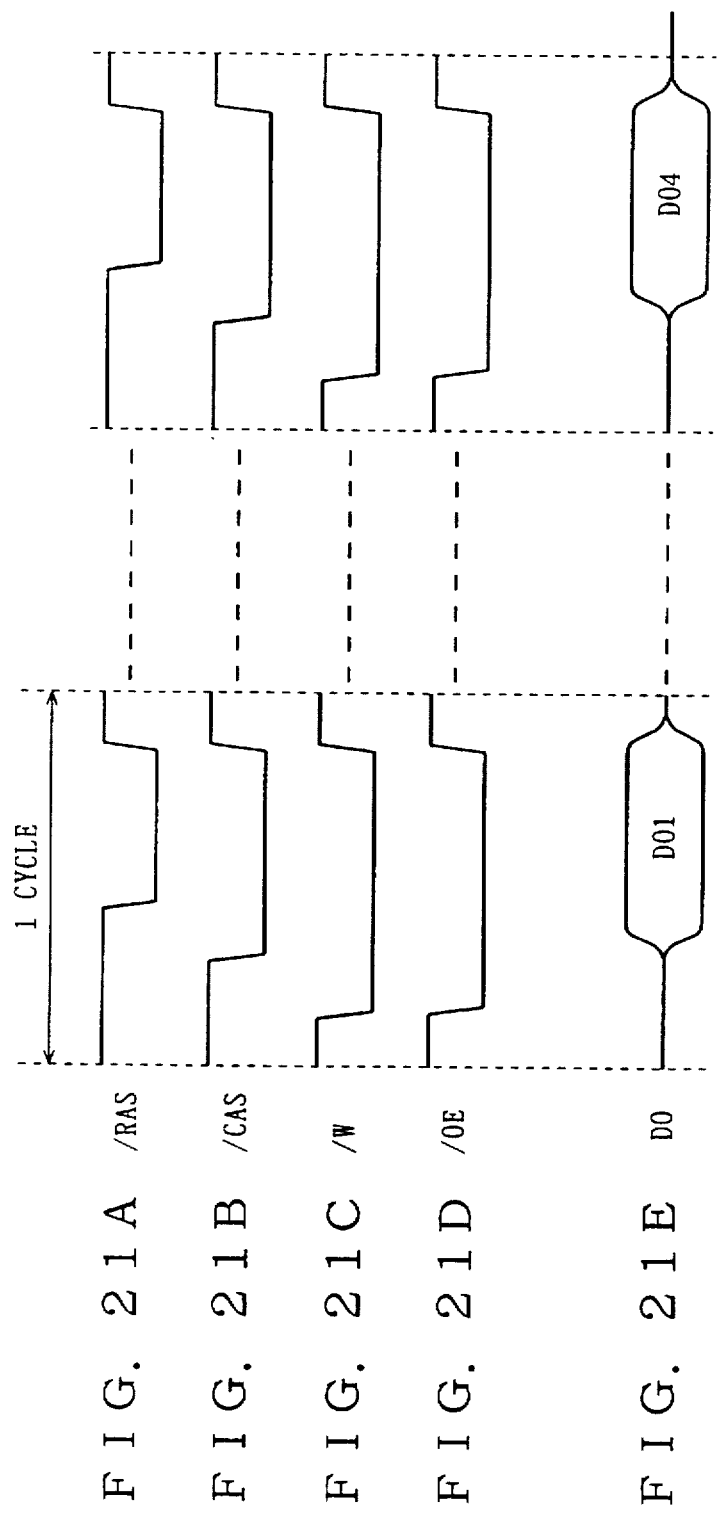
FIGS. 21A–21E are timing charts showing an operation of the sequential output circuit illustrated in FIG. 20.

FIG. 20 is a circuit block diagram illustrating a configuration of a main portion of a DRAM according to the fifth embodiment.

Referring to FIG. 20, a sequential output circuit 70 is newly provided for the DRAM as a difference between this DRAM and the conventional DRAM. In sequential output circuit 70, gate circuit 21.0 in sequential output circuit 20 in FIG. 8 is removed and signal /TE is replaced with signal /TE'. When signals /CAS and /RAS sequentially fall to "L" level after signals /OE and /W become "L" level, signal /TE' attains "L" level responsive to that. Signals /RE1–/RE4 are produced in the signal generating circuit in FIG. 18.

As shown in FIGS. 21A–21E, signals /OE, /W, /CAS, and /RAS are input four times at a timing at which signals /CAS and /RAS sequentially fall to "L" level after signals /OE and /W become "L" level, and data DO1–DO4 are sequentially output in synchronization with the input of signals /OE, /W, /CAS, and /RAS.

According to the fifth embodiment, an effect similar to that of the third embodiment can be obtained.

(Sixth Embodiment)

Figure 22:
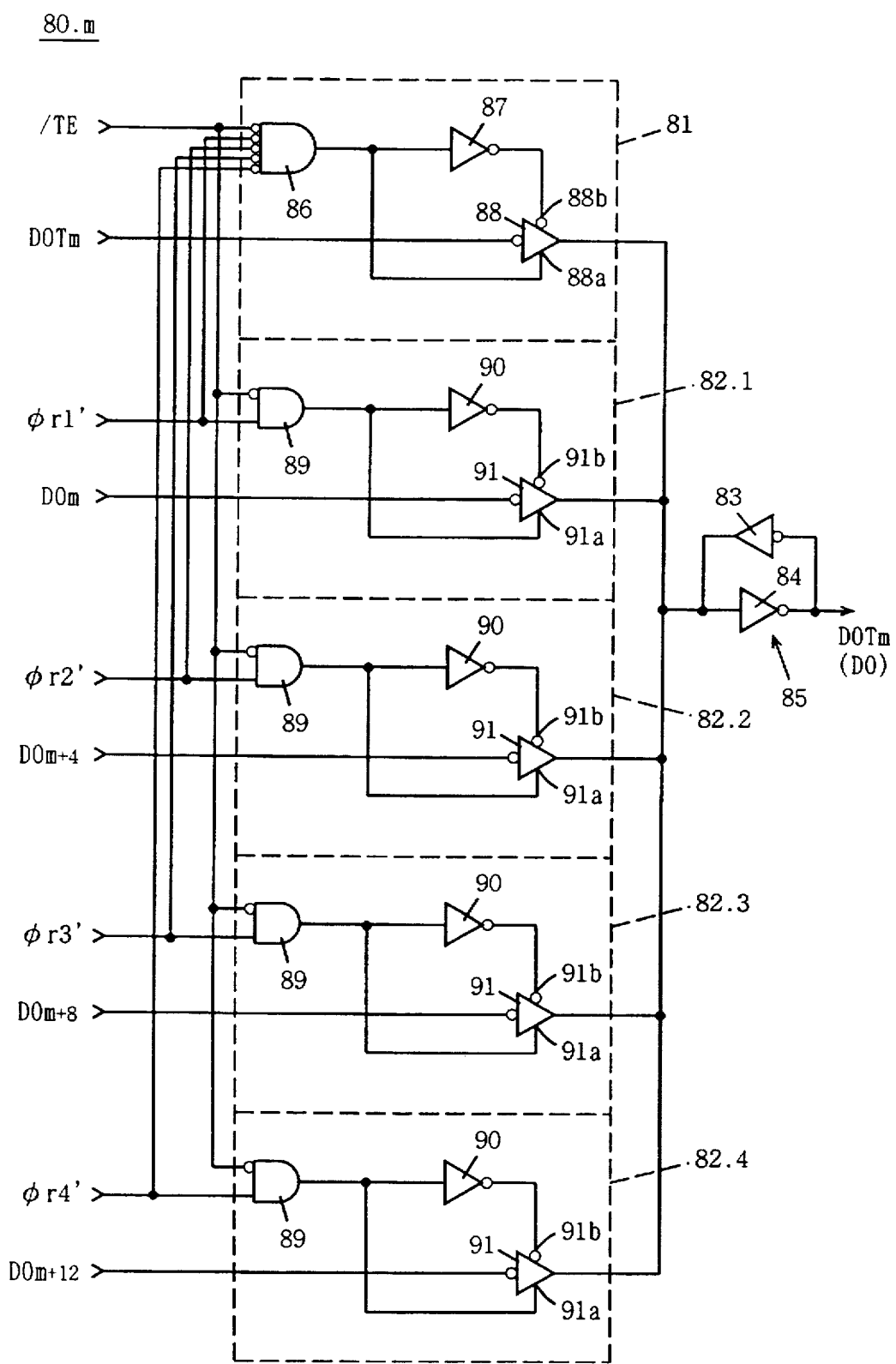
FIG. 22 is a circuit block diagram showing a configuration of a sequential output circuit of a DRAM according to the sixth embodiment of the invention.
Figure 23:
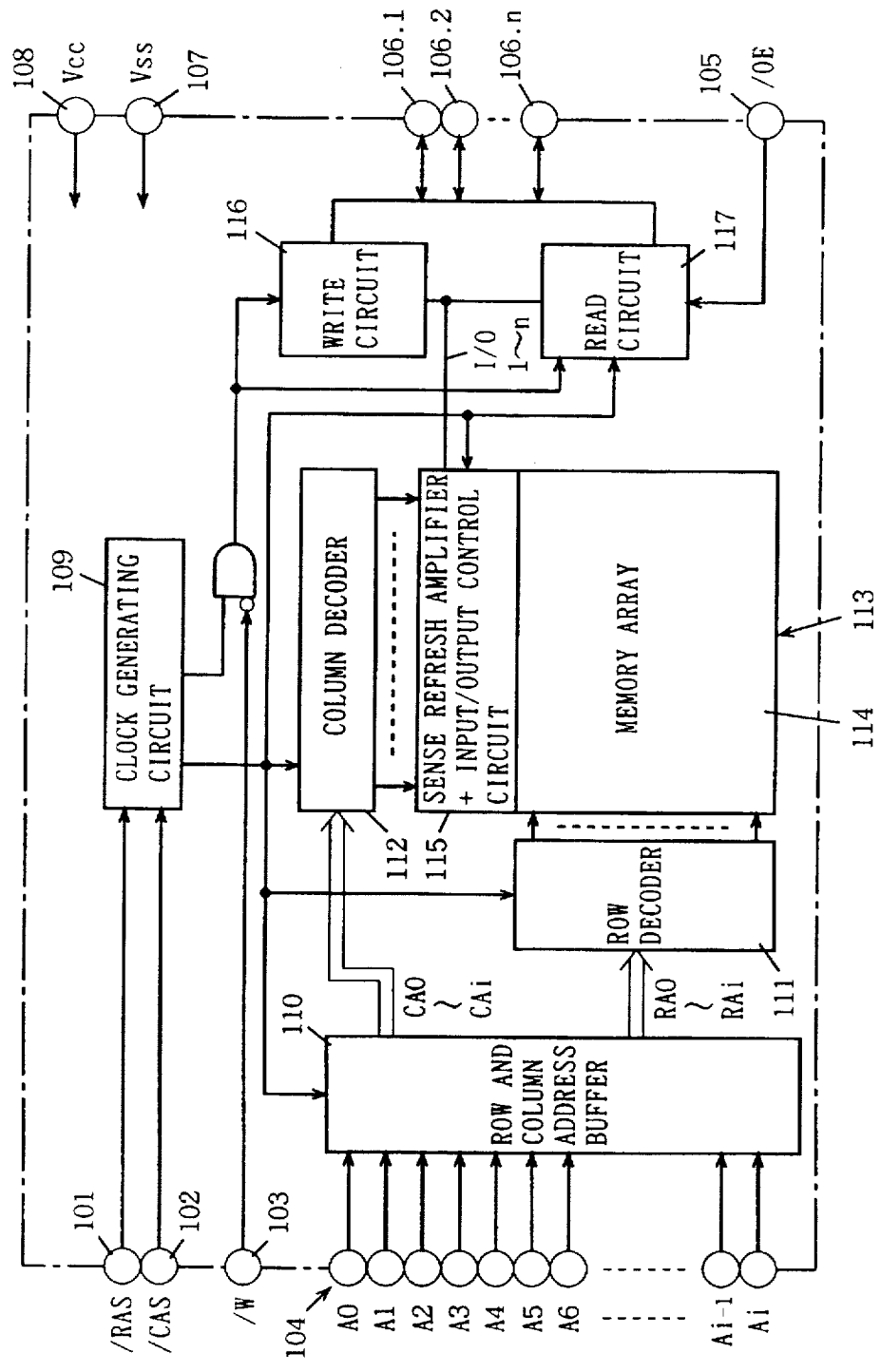
FIG. 23 is a block diagram of a partially omitted circuit illustrating the entire configuration of a conventional DRAM.
Figure 24:
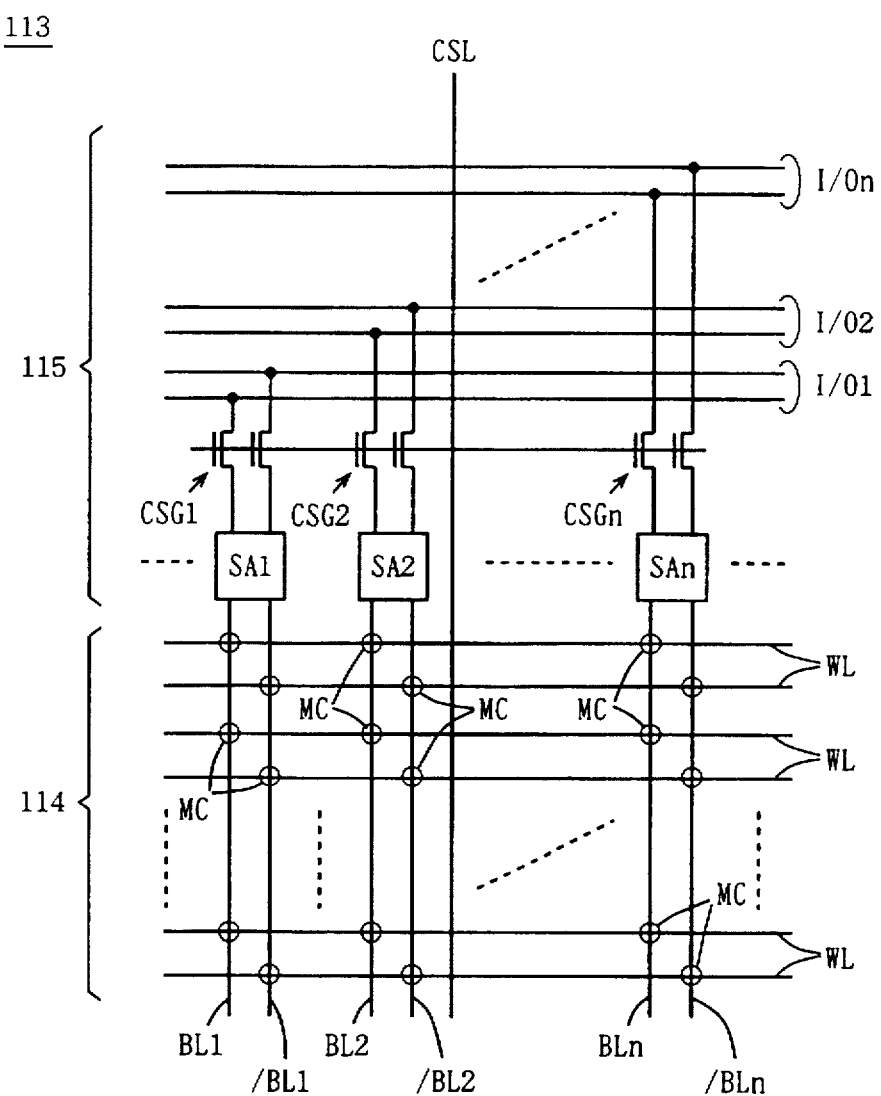
FIG. 24 is a block diagram of a partially omitted circuit illustrating a configuration of a memory mat of the DRAM shown in FIG. 23.

A DRAM according to the sixth embodiment includes sixteen data input/output terminals 106.1–106.16 as well as four data equality/inequality determination circuits 120.1–120.4. In the I/O compression mode, sixteen data DO1–DO16 are read out in parallel and equality/inequality of data DO1–DO4, DO5–DO8, DO9–DO12, and DO13–DO16 are respectively determined by data equality/inequality determination circuits 120.1–120.4. Output data DO1–DO4 from data equality/inequality determination circuits 120.1–120.4 are respectively supplied to data input/output terminals 106.1, 106.5, 106.9 and 106.13. Sequential output circuits 80.m (m=1, 2, 3, 4) in FIG. 22 are respectively arranged corresponding to data input/output terminals 106.1, 106.5, 106.9, and 106.13.

Sequential output circuit 80.m includes gate circuits 81, 82.1–82.4 and a latch circuit 85. Latch circuit 85 includes two inverters 83 and 84 connected in parallel in the directions opposite to each other. Gate circuit 81 includes an NOR gate 86, an inverter 87, and a switching inverter 88. NOR gate 86 receives signals /TE and φr1'–φr4'. An output from NOR gate 86 is supplied to a ground node 88b of switching inverter 88 via inverter 87, and directly supplied to a supply node 88a of switching inverter 88. Switching inverter 88 receives output DOTm from data equality/inequality determination circuit 120.m.

Gate circuits 82.1–82.4 respectively include gate elements 89, inverters 90, and switching inverters 91. Gate elements 89 in gate circuits 82.1–82.4 respectively receive signals φr1 –φr4', and passes signals φr1'–φr4' respectively when signal /TE attains "L" level. An output from gate element 89 is supplied to ground node 91b of switching inverter 91 via inverter 90, and directly input to supply node 91a of switching inverter 91. Switching inverters 91 in gate circuits 82.1–82.4 respectively receive read data DOm, DOm+4, DOm+8, and DOm+12.

Outputs from switching inverter 88 in gate circuit 81 and from switching inverters 91 in gate circuits 82.1–82.4 are supplied to latch circuit 85. An output from latch circuit 85 is input to the test device via a corresponding data input terminal 106.1, 106.5, 106.9, or 106.13.

As signals φr1–φr4 described in the first embodiment, signals φr1'–φr4' are generated by applying the super Vcc level to the input terminal of a specific address signal at the entry of the I/O compression mode. All of the signals φr1'–φr4' become "L" level, or any one of signals φr1'–φr4' attains H level.

After entry of the I/O compression mode, signal /TE becomes "L" level. When all of the signals φr1'–φr4' are "L" level, switching inverter 88 in gate circuit 81 is activated and output data DOT1–DOT4 from data equality/inequality determination circuits 120.1–120.4 are supplied to corresponding input/output terminals 106.1, 106.5, 106.9, and 106.13 respectively via latch circuit 85.

If only the signal φr1' among signals φr1'–φr4' is "H" level, switching inverter 91 in gate circuit 82.1 is activated and read data DO1–DO4 are output to corresponding data input/output terminals 106.1, 106.5, 106.9, and 106.13 via corresponding latch circuit 85 respectively.

If only the signal φr2' among signals φr1'–φr4' is "H" level, switching inverter 91 in gate circuit 82.2 is activated, and read data DO5–DO8 are supplied to corresponding data input/output terminals 106.1, 106.5, 106.9, and 106.13 via corresponding latch circuit 85 respectively.

If only the signal φr3' among signals φr1'–φr4' is "H" level, switching inverter 91 in gate circuit 82.3 is activated and read data DO9–DO12 are respectively supplied to corresponding data input/output terminals 106.1, 106.5, 106.9, and 106.13 via corresponding latch circuit 85.

If only the signal φr4' among signals φr1'–φr4' is "H" level, switching inverter 91 in gate circuit 82.4 is activated, and read data DO13–DO16 are respectively applied to corresponding data input/output terminals 106.1, 106.5, 106. 9, and 106.13 via corresponding latch circuit 85.

According to this embodiment, an effect similar to that of the first embodiment can be obtained. Further, even if the number of data input/output terminals increases, the device can be adjusted easily.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a test mode in which a plurality of data input/output terminals are compressed into one predetermined data input/output terminal, comprising:

a memory array including a plurality of memory cells arranged in rows and columns and divided into groups in advance each having the same number of the memory cells as of said data input/output terminals;

first select means for selecting any of the groups in said memory array according to an address signal;

second select means for selecting any of the plurality of memory cells belonging to the group selected by said first select means according to a memory cell selection signal;

read means for reading out data in parallel in the plurality of memory cells belonging to the group selected by said first select means;

determination means responsive to a first test signal for determining whether the plurality of data read by said read means are equal to each other and outputting data according to the result of the determination to said predetermined data input/output terminal; and gate means responsive to a second test signal for passing data read from the memory cell selected by said second select means among the plurality of data read by said read means to said predetermined data input/output terminal.

2. The semiconductor memory device according to claim 1, wherein said first and second test signals are externally supplied via said predetermined data input/output terminal.

3. The semiconductor memory device according to claim 1, wherein said second select means sequentially selects each of the plurality of memory cells belonging to the group selected by said first select means.

4. The semiconductor memory device according to claim 1, further comprising an address input terminal receiving said address signal supplied thereto, wherein said memory cell selection signal is externally supplied via said address input terminal.

5. A semiconductor memory device having a test mode in which a plurality of data input/output terminals are compressed into one predetermined data input/output terminal, comprising:

a memory array including a plurality of memory cells arranged in rows and columns and divided into groups in advance each having the same number of the memory cells as of said data input/output terminals;

first select means for selecting any of the groups in said memory array according to an address signal;

second select means for selecting any of the memory cells in the group selected by said first select means according to a memory cell selection signal;

first write means responsive to a first test signal for writing data in parallel supplied to said predetermined data input/output terminal into the plurality of memory cells in the group selected by said first select means; and second write means responsive to a second test signal for writing data supplied to said predetermined data input/output terminal into the memory cell selected by said second select means.

6. The semiconductor memory device according to claim 5, wherein said second select means sequentially selects each of the plurality of memory cells belonging to the group selected by said first select means.

7. The semiconductor memory device according to claim 5, further comprising an address signal input terminal receiving said address signal supplied thereto, wherein said memory cell selection signal is externally supplied via said address signal input terminal.

8. The semiconductor memory device according to claim 5, further comprising:

read means responsive to a read control signal for reading out data in parallel in the plurality of memory cells belonging to the group selected by said first select means;

determination means responsive to a third test signal for determining whether the plurality of data read by said read means are equal or not and outputting data according to the result of the determination to said predetermined data input/output terminal; and gate means responsive to a fourth test signal for passing data read from the memory cell selected by said second select means among the plurality of data read by said read means to said predetermined data input/output terminal.

9. The semiconductor memory device according to claim 8, wherein said third and fourth test signals are externally supplied via said predetermined data input/output terminal.

10. A semiconductor memory device including a plurality of groups of data input/output terminals respectively having a plurality of data input/output terminals, and having a test mode in which the plurality of data input/output terminals in each group are compressed into one predetermined data input/output terminal in each group, comprising:

a plurality of memory arrays respectively provided corresponding to said plurality of groups of data input/output terminals and respectively including a plurality of memory cells arranged in rows and columns and divided into groups in advance each having the same number of the memory cells as of the plurality of data input/output terminals in the corresponding group;

first select means for selecting any of said plurality of memory arrays according to a memory array selection signal;

second select means provided corresponding to each memory array for selecting any of the groups in the corresponding memory array according to an address signal;

read means provided corresponding to each memory array for reading out data in parallel in the plurality of memory cells belonging to the group selected by corresponding second select means;

determination means provided corresponding to each memory array and responsive to a first test signal for determining whether the plurality of data read by corresponding read means are equal or not and outputting data according to the result of the determination to corresponding predetermined data input/output terminal; and gate means responsive to a second test signal for passing the plurality of data read by said read means from the group selected by said second select means in the memory array selected by said first select means to said plurality of predetermined data input/output terminals respectively.

* * * * *